United States Patent
Sato et al.

(10) Patent No.: US 12,408,383 B2
(45) Date of Patent: *Sep. 2, 2025

(54) SEMICONDUCTOR DEVICE, SEMICONDUCTOR WAFER, AND ELECTRONIC DEVICE

(71) Applicant: Semiconductor Energy Laboratory Co., Ltd., Kanagawa-ken (JP)

(72) Inventors: Eri Sato, Kanagawa (JP); Tatsuya Onuki, Kanagawa (JP); Yuto Yakubo, Kanagawa (JP); Hitoshi Kunitake, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/411,830

(22) Filed: Jan. 12, 2024

(65) Prior Publication Data

US 2024/0154040 A1  May 9, 2024

Related U.S. Application Data

(63) Continuation of application No. 17/284,553, filed as application No. PCT/IB2019/058754 on Oct. 15, 2019, now Pat. No. 11,935,961.

(30) Foreign Application Priority Data

Oct. 18, 2018 (JP) .................. 2018-196390
Jan. 25, 2019 (JP) .................. 2019-011578

(51) Int. Cl.
*H03F 3/45* (2006.01)
*H10D 30/67* (2025.01)
*H10D 62/80* (2025.01)

(52) U.S. Cl.
CPC ......... *H10D 30/6755* (2025.01); *H10D 62/80* (2025.01); *H10D 30/6732* (2025.01); *H10D 30/6745* (2025.01); *H10D 30/6746* (2025.01)

(58) Field of Classification Search
CPC ...................................... H03F 3/45
(Continued)

(56) References Cited

U.S. PATENT DOCUMENTS

| | | | |
|---|---|---|---|
| 4,197,511 A | 4/1980 | Sequin et al. | |
| 4,540,952 A | 9/1985 | Williams | |

(Continued)

FOREIGN PATENT DOCUMENTS

| | | |
|---|---|---|
| CN | 101276428 A | 10/2008 |
| CN | 101847971 A | 9/2010 |

(Continued)

OTHER PUBLICATIONS

Chinese Office Action (Application No. 201980067176.X) Dated Jan. 27, 2024.

(Continued)

*Primary Examiner* — Henry Choe
(74) *Attorney, Agent, or Firm* — Husch Blackwell LLP

(57) ABSTRACT

A semiconductor device capable of measuring a minute current is provided. The semiconductor device includes an operational amplifier and a diode element. An inverting input terminal of the operational amplifier and an input terminal of the diode element are electrically connected to a first terminal to which current is input, and an output terminal of the operational amplifier and an output terminal of the diode element are electrically connected to a second terminal from which voltage is output. A diode-connected transistor that includes a metal oxide in a channel formation region is used as the diode element. Since the off-state current of the transistor is extremely low, a minute current (Continued)

can flow between the first terminal and the second terminal. Thus, when voltage is output from the second terminal, a minute current that flows through the first terminal can be estimated from the voltage.

10 Claims, 25 Drawing Sheets

(58) Field of Classification Search
USPC .................................................. 330/85, 260
See application file for complete search history.

(56) References Cited

U.S. PATENT DOCUMENTS

| | | | |
|---|---|---|---|
| 4,574,249 A | | 3/1986 | Williams |
| 4,705,946 A | * | 11/1987 | Cargille ................ H03G 11/00 |
| | | | 250/342 |
| 4,876,534 A | | 10/1989 | Mead et al. |
| 5,216,385 A | * | 6/1993 | McDaniel .............. H03G 3/001 |
| | | | 330/86 |
| 5,442,282 A | | 8/1995 | Rostoker et al. |
| 5,493,253 A | | 2/1996 | Ogou |
| 5,539,325 A | | 7/1996 | Rostoker et al. |
| 5,757,299 A | | 5/1998 | Noro et al. |
| 5,838,163 A | | 11/1998 | Rostoker et al. |
| 6,018,262 A | | 1/2000 | Noro et al. |
| 6,246,284 B1 | | 6/2001 | Nemoto |
| 6,538,491 B1 | * | 3/2003 | Spanoche ............ H03K 17/145 |
| | | | 327/344 |
| 6,809,589 B2 | * | 10/2004 | Manganaro ......... H03F 3/45107 |
| | | | 330/110 |
| 7,002,397 B2 | | 2/2006 | Kubo et al. |
| 8,149,054 B2 | | 4/2012 | Shibuya |
| 8,242,837 B2 | | 8/2012 | Yamazaki et al. |
| 8,350,621 B2 | | 1/2013 | Yamazaki et al. |
| 8,803,589 B2 | | 8/2014 | Yamazaki et al. |
| 8,988,133 B2 | | 3/2015 | Briere |
| 9,041,442 B2 | | 5/2015 | Yamamoto et al. |
| 9,200,952 B2 | | 12/2015 | Kozuma |
| 9,294,058 B2 | | 3/2016 | Yamamoto et al. |
| 9,419,020 B2 | | 8/2016 | Yamazaki et al. |
| 9,431,435 B2 | | 8/2016 | Ando et al. |
| 9,653,479 B2 | | 5/2017 | Miyairi et al. |
| 9,692,415 B2 | | 6/2017 | Okamoto |
| 9,716,109 B2 | | 7/2017 | Yamazaki et al. |
| 9,780,201 B2 | | 10/2017 | Ando et al. |
| 10,014,851 B2 | * | 7/2018 | Chauhan ............ H03K 17/687 |
| 10,050,060 B2 | | 8/2018 | Miyairi et al. |
| 10,115,743 B2 | | 10/2018 | Yamazaki et al. |
| 10,186,604 B2 | | 1/2019 | Ando et al. |
| 10,319,744 B2 | | 6/2019 | Yamazaki et al. |
| 10,957,714 B2 | | 3/2021 | Yamazaki et al. |
| 2007/0273411 A1 | | 11/2007 | Harris et al. |
| 2012/0112836 A1 | | 5/2012 | Shibuya |
| 2013/0015332 A1 | | 1/2013 | Kozuma |
| 2013/0015501 A1 | | 1/2013 | Briere |
| 2013/0015919 A1 | | 1/2013 | Kropfitsch et al. |
| 2017/0077883 A1 | | 3/2017 | Chang |
| 2021/0210519 A1 | | 7/2021 | Yamazaki et al. |

FOREIGN PATENT DOCUMENTS

| | | |
|---|---|---|
| CN | 102064692 A | 5/2011 |
| CN | 106508091 B | 6/2011 |
| CN | 105659369 A | 6/2016 |
| CN | 106888006 A | 6/2017 |
| EP | 0579993 A | 1/1994 |
| EP | 0704980 A | 4/1996 |
| EP | 2546986 A | 1/2013 |
| EP | 2546987 A | 1/2013 |
| JP | 57-107621 A | 7/1982 |
| JP | 58-053246 A | 3/1983 |
| JP | 05-180695 A | 7/1993 |
| JP | 05-347515 A | 12/1993 |
| JP | 06-077298 A | 3/1994 |
| JP | 07-106875 A | 4/1995 |
| JP | 08-125462 A | 5/1996 |
| JP | 11-311644 A | 11/1999 |
| JP | 2000/045437 | 5/2002 |
| JP | 2004-304708 A | 10/2004 |
| JP | 2007-035919 A | 2/2007 |
| JP | 2010-014652 A | 1/2010 |
| JP | 2012-137359 A | 7/2012 |
| JP | 2013-021329 A | 1/2013 |
| JP | 2013-040921 A | 2/2013 |
| JP | 2013-255222 A | 12/2013 |
| JP | 2016-040888 A | 3/2016 |
| KR | 2013-0009657 A | 1/2013 |
| TW | 201705427 | 2/2017 |
| TW | 201807829 | 3/2018 |
| WO | WO-2011/049005 | 4/2011 |
| WO | WO-2015/060318 | 4/2015 |

OTHER PUBLICATIONS

International Search Report (Application No. PCT/IB2019/058754) Dated Jan. 21, 2020.
Written Opinion (Application No. PCT/IB2019/058754) Dated Jan. 21, 2020.
Kunitake.H et al., "High thermal tolerance of 25-nm c-axis aligned crystalline In—Ga—Zn oxide FET", IEDM 18: Technical Digest of International Electron Devices Meeting, Dec. 1, 2018, pp. 312-315.
Taiwanese Office Action (Application No. 108137428) Dated Jul. 17, 2023.
Chinese Office Action (Application No. 201980067176.X) Dated Oct. 14, 2024.
Chinese Office Action (Application No. 201980067176.X) Dated Dec. 28, 2024.

* cited by examiner

FIG. 9A
| Amorphous | Crystalline | Crystal |
|---|---|---|
| completely amorphous | ·CAAC<br>·nc<br>·CAC | ·single crystal<br>·poly crystal |
FIG. 9B
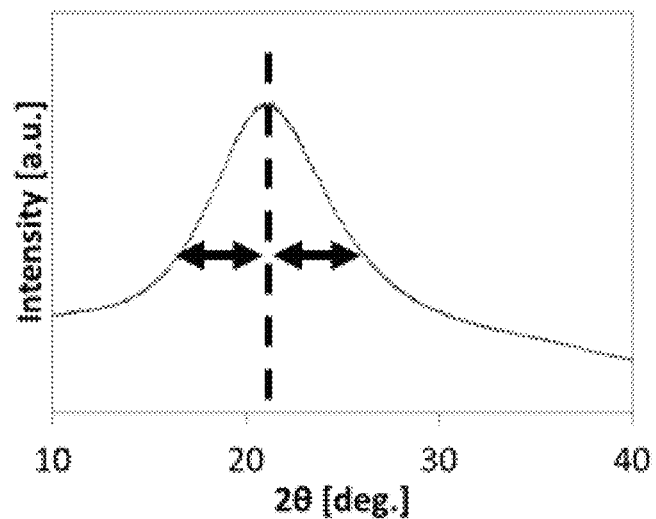
FIG. 9C
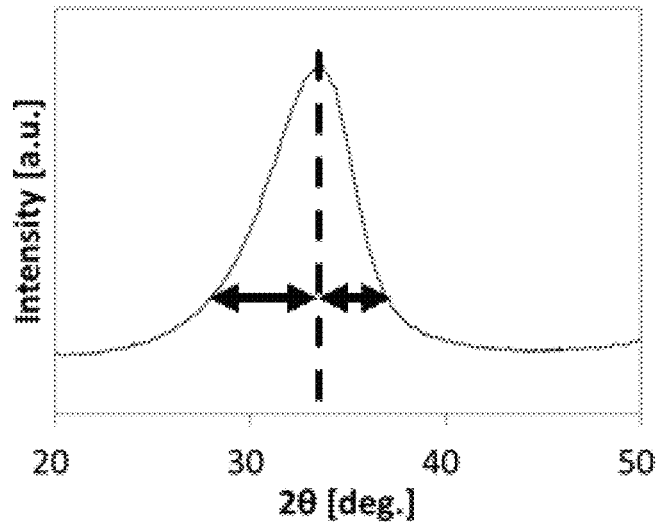

SEMICONDUCTOR DEVICE, SEMICONDUCTOR WAFER, AND ELECTRONIC DEVICE

This application is a continuation of copending U.S. application Ser. No. 17/284,553, filed on Apr. 12, 2021 which is a 371 of international application PCT/IB2019/058754 filed on Oct. 15, 2019 which are all incorporated herein by reference.

TECHNICAL FIELD

One embodiment of the present invention relates to a semiconductor device, a semiconductor wafer, and an electronic device.

Note that one embodiment of the present invention is not limited to the above technical field. The technical field of the invention disclosed in this specification and the like relates to an object, a method, or a manufacturing method. Alternatively, one embodiment of the present invention relates to a process, a machine, manufacture, or a composition of matter. Therefore, specific examples of the technical field of one embodiment of the present invention disclosed in this specification include a semiconductor device, a display device, a liquid crystal display device, a light-emitting device, a power storage device, an imaging device, a memory device, a signal processing device, a processor, an electronic device, a system, a driving method thereof, a manufacturing method thereof, and a testing method thereof.

BACKGROUND ART

A sensor has a function of converting a detected object into an electrical signal or the like, and when information relating to the object is converted into an electrical signal, processing can be performed in another device; for example, the information relating to the object is visually displayed by a display device, and the information relating to the object is stored by a memory device. Specifically, a sensor can convert the detected object into a current value and measure the current value, whereby the sensor can measure an amount relating to the object, for example. A device and a method for measuring current are disclosed in Patent Document 1, for example.

REFERENCE

Patent Document

[Patent Document 1] Japanese Published Patent Application No. 2012-137359

SUMMARY OF THE INVENTION

Problems to be Solved by the Invention

In a sensor for generating current by measuring physical quantity or the like, a method using an inverting amplifier circuit is given as an example of a means for reading the current. By this method, the current is regarded as input current, voltage is output by the non-inverting amplifier circuit, and the value of the input current is measured from the voltage. However, in recent years, the size of a sensor has been reduced and current output by a sensor becomes minute; therefore, a circuit for accurately reading a minute current is needed.

An object of one embodiment of the present invention is to provide a semiconductor device or the like that is capable of measuring a minute current. Another object of one embodiment of the present invention is to provide a novel semiconductor device and the like. Another object of one embodiment of the present invention is to provide a novel electronic device or the like that includes the semiconductor device.

Note that the objects of one embodiment of the present invention are not limited to the objects listed above. The objects listed above do not preclude the existence of other objects. Note that the other objects are objects that are not described in this section and will be described below. The objects that are not described in this section will be derived from the description of the specification, the drawings, and the like and can be extracted from the description by those skilled in the art. One embodiment of the present invention achieves at least one of the above objects and the other objects. Note that one embodiment of the present invention does not necessarily solve all the objects listed above and the other objects.

Means for Solving the Problems (1)

One embodiment of the present invention is a semiconductor device including a transistor and an operational amplifier. An inverting input terminal of the operational amplifier is electrically connected to a first terminal and a gate of the transistor, an output terminal of the operational amplifier is electrically connected to a second terminal of the transistor, and the transistor includes a metal oxide in a channel formation region.

(2)

Another embodiment of the present invention is the semiconductor device having the above structure (1), in which an off-state current of the transistor is less than or equal to $1.0 \times 10^{-12}$ A.

(3)

Another embodiment of the present invention is the semiconductor device having the above structure (1), in which the transistor includes a back gate, and the semiconductor device has a function of making an off-state current of the transistor less than or equal to $1.0 \times 10^{-15}$ A by inputting a potential that shifts a threshold voltage of the transistor to a positive side, to the back gate.

(4)

Another embodiment of the present invention is a semiconductor device including a first circuit and an operational amplifier. An inverting input terminal of the operational amplifier is electrically connected to a first terminal of the first circuit, an output terminal of the operational amplifier is electrically connected to a second terminal of the first circuit, the first circuit includes a transistor, the transistor includes a metal oxide in a channel formation region, and the first circuit has a function of making a current less than or equal to $1.0 \times 10^{-12}$ A flow between the first terminal and the second terminal.

(5)

Another embodiment of the present invention is the semiconductor device having the above structure (4), in which the transistor includes a back gate.

(6)

Another embodiment of the present invention is the semiconductor device having any one of the above structures (1) to (5), in which the metal oxide includes an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, and magnesium).

(7)

Another embodiment of the present invention is a semiconductor wafer including a plurality of semiconductor devices having any one of the structures (1) to (6), and a region for dicing.

(8)

Another embodiment of the present invention is an electronic device including the semiconductor device having any one of the structures (1) to (6), a detection unit, and a housing. The detection unit has a function of outputting current when the detection unit detects a detection object, and the current is input to the semiconductor device.

Note that in this specification and the like, a semiconductor device refers to a device that utilizes semiconductor characteristics, and means a circuit including a semiconductor element (a transistor, a diode, a photodiode, and the like), a device including the circuit, and the like. The semiconductor device also means all devices that can function by utilizing semiconductor characteristics. For example, an integrated circuit, a chip including an integrated circuit, and an electronic component including a chip in a package are examples of the semiconductor device. Moreover, a memory device, a display device, a light-emitting device, a lighting device, an electronic device, and the like themselves might be semiconductor devices, or might include semiconductor devices.

In the case where there is a description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or texts, a connection relation other than one shown in drawings or texts is disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow an electrical connection between X and Y (e.g., a switch, a transistor, a capacitor, an inductor, a resistor, a diode, a display element, a light-emitting element, and a load) can be connected between X and Y Note that a switch has a function of being controlled to be turned on or off. That is, the switch has a function of being in a conduction state (on state) or a non-conduction state (off state) to determine whether current flows or not.

For example, in the case where X and Y are functionally connected, at least one circuit that enables functional connection between X and Y (e.g., a logic circuit (an inverter, a NAND circuit, a NOR circuit, or the like); a signal converter circuit (a DA converter circuit, an AD converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; or a control circuit) can be connected between X and Y For example, even when another circuit is interposed between X and Y, X and Y are functionally connected when a signal output from X is transmitted to Y.

Note that an explicit description, X and Y are electrically connected, includes the case where X and Y are electrically connected (that is, the case where X and Y are connected with another element or another circuit provided therebetween), the case where X and Y are functionally connected (that is, the case where X and Y are functionally connected with another circuit provided therebetween), and the case where X and Y are directly connected (that is, the case where X and Y are connected without another element or another circuit provided therebetween). That is, the explicit expression "X and Y are electrically connected" is the same as the explicit simple expression "X and Y are connected".

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, it can be expressed as "a source (or a first terminal or the like) of a transistor is electrically connected to X; a drain (or a second terminal or the like) of the transistor is electrically connected to Y; and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit structure is defined by an expression similar to the above examples, a source (or a first terminal or the like) and a drain (or a second terminal or the like) of a transistor can be distinguished from each other to specify the technical scope. Note that these expressions are examples and the expression is not limited to these expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, "electrical connection" in this specification includes in its category such a case where one conductive film has functions of a plurality of components.

In this specification and the like, a "resistor" can be, for example, a circuit element or a wiring having a resistance higher than 0Ω. Therefore, in this specification and the like, a "resistor" sometimes includes a wiring having a resistance value, a transistor in which current flows between the source and the drain, a diode, and a coil. Thus, the term "resistor" can be replaced with the terms "resistance", "load", and "a region having a resistance value", and the like; inversely, the terms "resistance", "load", and "a region having a resistance" can be replaced with the term "resistor" and the like. The resistance value can be, for example, preferably greater than or equal to 1 mΩ and less than or equal to 10Ω, further preferably greater than or equal to 5 mΩ and less than or equal to 5Ω, still further preferably greater than or equal to 10 mΩ and less than or equal to 1Ω. As another example, the resistance value may be greater than or equal to 1Ω and less than or equal to $1 \times 10^9$ Ω.

In this specification and the like, a "capacitor" can be, for example, a region of a wiring having an electrostatic capacitance value, parasitic capacitance, or gate capacitance of a transistor, in addition to a circuit element having an electrostatic capacitance higher than 0 F. Therefore, in this specification and the like, a "capacitor" sometimes includes not only a circuit element that has a pair of electrodes and a dielectric between the electrodes, but also parasitic capacitance generated between wirings, gate capacitance generated between a gate and one of a source and a drain of a transistor, and the like. The terms "capacitor", "parasitic capacitance", "gate capacitance", and the like can be replaced with the term "capacitance" and the like; inversely, the term "capacitance" can be replaced with the terms "capacitor", "parasitic capacitance", "gate capacitance", and the like. The term "pair of electrodes" of "capacitor" can be replaced with "pair of conductors", "pair of conductive regions", "pair of regions", and the like. Note that the electrostatic capacitance value can be greater than or equal to 0.05 fF and less than or equal to 10 pF, for example. Alternatively, the electrostatic capacitance value may be greater than or equal to 1 pF and less than or equal to 10 μF, for example.

In this specification and the like, a transistor includes three terminals called a gate, a source, and a drain. The gate functions as a control terminal for controlling the conducting state of the transistor. Two terminals functioning as the source and the drain are input/output terminals of the transistor. One of the two input/output terminals serves as the source and the other serves as the drain on the basis of the conductivity type (n-channel type or p-channel type) of the transistor and the levels of potentials applied to the three terminals of the transistor. Thus, the terms of source and drain are interchangeable in this specification and the like. In this specification and the like, expressions "one of a source and a drain" (or a first electrode or a first terminal) and "the other of the source and the drain" (or a second electrode or a second terminal) are used in description of the connection relation of a transistor. Depending on the structure, a transistor may include a back gate in addition to the above three terminals. In that case, in this specification and the like, one of the gate and the back gate of the transistor may be referred to as a first gate and the other of the gate and the back gate of the transistor may be referred to as a second gate. Moreover, the terms "gate" and "back gate" can be replaced with each other in one transistor. In the case where a transistor includes three or more gates, the gates may be referred to as a first gate, a second gate, and a third gate, for example, in this specification and the like.

In this specification and the like, a node can be referred to as a terminal, a wiring, an electrode, a conductive layer, a conductor, an impurity region, or the like depending on the circuit configuration, the device structure, or the like. Furthermore, a terminal, a wiring, or the like can be referred to as a node.

In this specification and the like, "voltage" and "potential" can be replaced with each other as appropriate. The "voltage" refers to a potential difference from a reference potential. When the reference potential is a ground potential, for example, the "voltage" can be expressed as the "potential". Note that the ground potential does not necessarily mean 0 V. Moreover, potentials are relative values, and a potential supplied to a wiring, a potential applied to a circuit and the like, a potential output from a circuit and the like, for example, are changed with a change of the reference potential.

"Current" refers to as a charge transfer (electrical conduction); for example, the description "electrical conduction of positively charged particles occurs" can be rephrased as "electrical conduction of negatively charged particles occurs in the opposite direction". Therefore, unless otherwise specified, "current" in this specification and the like refers to a charge transfer (electrical conduction) accompanied by carrier movement. Examples of a carrier here include an electron, a hole, an anion, a cation, and a complex ion, and the type of carrier differs between current flow systems (e.g., a semiconductor, a metal, an electrolyte solution, and a vacuum). The "direction of current" in a wiring or the like refers to the direction in which a positive carrier moves, and the amount of current is expressed as a positive value. In other words, the direction in which a negative carrier moves is opposite to the direction of current, and the amount of current is expressed as a negative value. Thus, in the case where the polarity of current (or the direction of current) is not specified in this specification and the like, the description "current flows from element A to element B" can be rephrased as "current flows from element B to element A", for example. The description "current is input to element A" can be rephrased as "current is output from element A", for example.

Ordinal numbers such as "first", "second", and "third" in this specification and the like are used in order to avoid confusion among components. Thus, the ordinal numbers do not limit the number of components. In addition, the ordinal numbers do not limit the order of components. In this specification and the like, for example, a "first" component in one embodiment can be referred to as a "second" component in other embodiments or claims. Moreover, in this specification and the like, for example, a "first" component in one embodiment can be omitted in other embodiments or claims.

In this specification and the like, terms for describing arrangement, such as "over" and "under", are sometimes used for convenience to describe the positional relation between components with reference to drawings. The positional relation between components is changed as appropriate with a direction in which each component is described. Thus, terms for the description are not limited to terms used in the specification and the like, and the description can be made appropriately depending on the situation. For example, the expression "an insulator over (on) a top surface of a conductor" can be replaced with the expression "an insulator on a bottom surface of a conductor" when the direction of a drawing showing these components is rotated by 180°.

Furthermore, the term "over" or "under" does not necessarily mean that a component is placed directly on or directly under and in direct contact with another component. For example, the expression "electrode B over insulating layer A" does not necessarily mean that the electrode B is on and in direct contact with the insulating layer A and can mean the case where another component is provided between the insulating layer A and the electrode B.

In this specification and the like, the terms "film", "layer", and the like can be interchanged with each other according to circumstances. For example, the term "conductive layer" can be changed into the term "conductive film" in some cases. Moreover, the term "insulating film" can be changed into the term "insulating layer" in some cases. Alternatively, the term "film", "layer", or the like is not used and can be interchanged with another term depending on the case or according to circumstances. For example, the term "conductive layer" or "conductive film" can be changed into the term "conductor" in some cases. Furthermore, for example, the term "insulating layer" or "insulating film" can be changed into the term "insulator" in some cases.

In this specification and the like, the term such as "electrode" or "wiring" does not limit the function of a component. For example, an "electrode" is used as part of a "wiring" in some cases, and vice versa. Furthermore, the term "electrode" or "wiring" can also mean a combination of a plurality of electrodes or wirings provided in an integrated manner, for example.

In this specification and the like, the terms "wiring", "signal line", "power supply line", and the like can be interchanged with each other depending on the case or according to circumstances. For example, the term "wiring" can be changed into the term "signal line" in some cases. As another example, the term "wiring" can be changed into the term "power supply line" in some cases. Inversely, the term "signal line", "power supply line", or the like can be changed into the term "wiring" in some cases. The term "power supply line" or the like can be changed into the term "signal line" or the like in some cases. Inversely, the term "signal line" or the like can be changed into the term "power supply line" or the like in some cases. The term "potential" that is applied to a wiring can be changed into the term "signal" or the like depending on the case or according to circumstances. Inversely, the term "signal" or the like can be changed into the term "potential" in some cases.

In this specification and the like, a switch is in a conduction state (on state) or a non-conduction state (off state) to determine whether current flows or not. Alternatively, a switch has a function of selecting and changing a current path. For example, an electrical switch or a mechanical switch can be used. That is, a switch can be any element capable of controlling current, and is not limited to a certain element.

Examples of an electrical switch include a transistor (e.g., a bipolar transistor and a MOS transistor), a diode (e.g., a PN diode, a PIN diode, a Schottky diode, a MIM (Metal Insulator Metal) diode, a MIS (Metal Insulator Semiconductor) diode, and a diode-connected transistor), and a logic circuit in which such elements are combined. Note that in the case of using a transistor as a switch, a "conduction state" of the transistor refers to a state where a source electrode and a drain electrode of the transistor can be regarded as being electrically short-circuited. Furthermore, a "non-conduction state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch formed using a MEMS (micro electro mechanical system) technology. Such a switch includes an electrode that can be moved mechanically, and operates by controlling conduction and non-conduction with movement of the electrode.

In this specification and the like, an impurity in a semiconductor refers to an element other than a main component of a semiconductor layer, for example. For example, an element with a concentration of lower than 0.1 atomic % is an impurity. If a semiconductor contains an impurity, formation of the DOS (Density of States) in the semiconductor, decrease in the carrier mobility, or decrease in the crystallinity may occur, for example. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components; specific examples are hydrogen (contained also in water), lithium, sodium, silicon, boron, phosphorus, carbon, and nitrogen. Specifically, when the semiconductor is a silicon layer, examples of an impurity that changes characteristics of the semiconductor include oxygen, Group 1 elements except hydrogen, Group 2 elements, Group 13 elements, and Group 15 elements.

In this specification and the like, In:Ga:Zn=4:2:3 or a composition that is a neighborhood thereof refers to a composition where, when In is 4 with respect to the total number of atoms, Ga is greater than or equal to 1 and less than or equal to 3 ($1 \leq Ga \leq 3$) and Zn is greater than or equal to 2 and less than or equal to 4.1 ($2 \leq Zn \leq 4.1$). In:Ga:Zn=5:1:6 or a composition that is a neighborhood thereof refers to a composition where, when In is 5 with respect to the total number of atoms, Ga is greater than 0.1 and less than or equal to 2 ($0.1 \leq Ga \leq 2$) and Zn is greater than or equal to 5 and less than or equal to 7 ($5 \leq Zn \leq 7$). In:Ga:Zn=1:1:1 or a composition that is a neighborhood thereof refers to a composition where, when In is 1 with respect to the total number of atoms, Ga is greater than 0.1 and less than or equal to 2 ($0.1 < Ga \leq 2$) and Zn is greater than 0.1 and less than or equal to 2 ($0.1 < Zn \leq 2$). In:Ga:Zn=5:1:3 or a composition that is a neighborhood thereof refers to a composition where, when In is 5 with respect to the total number of atoms, Ga is greater than or equal to 0.5 and less than or equal to 1.5 ($0.5 \leq Ga \leq 1.5$) and Zn is greater than or equal to 2 and less than or equal to 4.1 ($2 \leq Zn \leq 4.1$). In:Ga:Zn=10:1:3 or a composition that is a neighborhood thereof refers to a composition where, when In is 10 with respect to the total number of atoms, Ga is greater than or equal to 0.5 and less than or equal to 1.5 ($0.5 \leq Ga \leq 1.5$) and Zn is greater than or equal to 2 and less than or equal to 4.1 ($2 \leq Zn \leq 4.1$).

Effect of the Invention

According to one embodiment of the present invention, a semiconductor device or the like that is capable of measuring a minute current can be provided. According to another embodiment of the present invention, a novel semiconductor device or the like can be provided. According to another embodiment of the present invention, a novel electronic device or the like that includes the semiconductor device can be provided.

Note that the effects of one embodiment of the present invention are not limited to the effects listed above. The effects listed above do not preclude the existence of other effects. Note that the other effects are effects that are not described in this section and will be described below. The other effects that are not described in this section will be derived from the description of the specification, the drawings, and the like and can be extracted from the description by those skilled in the art. Note that one embodiment of the present invention has at least one of the effects listed above and the other effects. Accordingly, depending on the case, one embodiment of the present invention does not have the effects listed above in some cases.

BRIEF DESCRIPTION OF THE DRAWINGS

FIG. 9A is a table showing crystal structures of oxide semiconductors, FIG. 9B shows an XRD spectrum of quartz glass, and FIG. 9C shows an XRD spectrum of crystalline IGZO.

MODE FOR CARRYING OUT THE INVENTION

Figure 1A:
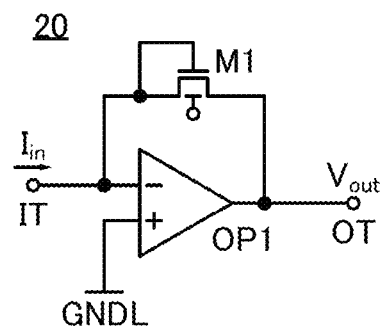
FIG. 1A, FIG. 1B, and FIG. 1C are circuit diagrams illustrating examples of a semiconductor device.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in an active layer of a transistor, the metal oxide is referred to as an oxide semiconductor in some cases. That is, when a metal oxide can form a channel formation region of a transistor that has at least one of an amplifying function, a rectifying function, and a switching function, the metal oxide can be referred to as a metal oxide semiconductor. Moreover, when an OS FET or an OS transistor is described, it can also be referred to as a transistor including a metal oxide or an oxide semiconductor.

Furthermore, in this specification and the like, a metal oxide containing nitrogen is also collectively referred to as a metal oxide in some cases. A metal oxide containing nitrogen may be referred to as a metal oxynitride.

In this specification and the like, one embodiment of the present invention can be constituted by appropriately combining a structure described in an embodiment with any of the structures described in the other embodiments. In addition, in the case where a plurality of structure examples are described in one embodiment, the structure examples can be combined as appropriate Note that a content (or part of the content) described in one embodiment can be applied to, combined with, or replaced with at least one of another content (or part of the content) in the embodiment and a content (or part of the content) described in one or a plurality of different embodiments.

Note that in each embodiment, content described in the embodiment is content described using a variety of diagrams or content described with text disclosed in the specification.

Note that by combining a diagram (or part thereof) described in one embodiment with at least one of another part of the diagram, a different diagram (or part thereof) described in the embodiment, and a diagram (or part thereof) described in one or a plurality of different embodiments, much more diagrams can be formed.

Embodiments described in this specification are described with reference to the drawings. Note that the embodiments can be implemented in many different modes, and it will be readily appreciated by those skilled in the art that modes and details can be changed in various ways without departing from the spirit and scope thereof. Therefore, the present invention should not be interpreted as being limited to the description in the embodiments. Note that in the structures of the invention in the embodiments, the same portions or portions having similar functions are denoted by the same reference numerals in different drawings, and repeated description thereof is omitted in some cases. In perspective views and the like, some components might not be illustrated for clarity of the drawings.

In this specification and the like, when a plurality of components are denoted by the same reference numerals, and in particular need to be distinguished from each other, an identification sign such as "_1", "[n]", or "[m,n]" is sometimes added to the reference numerals.

In the drawings in this specification, the size, the layer thickness, or the region is exaggerated for clarity in some cases. Therefore, they are not limited to the illustrated scale. Note that the drawings are schematic views illustrating ideal examples, and embodiments of the present invention are not limited to shapes or values shown in the drawings. For example, variation in signal, voltage, or current due to noise, variation in signal, voltage, or current due to difference in timing, or the like can be included.

Embodiment 1

In this embodiment, a circuit capable of measuring a minute current that is a semiconductor device of one embodiment of the present invention will be described.

FIG. 1A illustrates a circuit capable of measuring current, which is the semiconductor device of one embodiment of the present invention. A circuit 20 includes a transistor M1 and an operational amplifier OP1. The circuit 20 further includes an input terminal IT and an output terminal OT.

The transistor M1 is an OS transistor that includes a metal oxide in a channel formation region. For example, one or more materials selected from indium, an element M (the element M is one or more kinds of materials selected from aluminum, gallium, yttrium, copper, vanadium, beryllium, boron, titanium, iron, nickel, germanium, zirconium, molybdenum, lanthanum, cerium, neodymium, hafnium, tantalum, tungsten, and magnesium), and zinc can be used for the metal oxide. In particular, a metal oxide including indium, gallium, and zinc is an intrinsic (also referred to as i-type) or substantially intrinsic semiconductor that has a large band gap, and the carrier concentration of the metal oxide is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, yet still further preferably lower than $1\times10^{12}$ cm$^{-3}$. The off-state current per micrometer of channel width of the OS transistor including the metal oxide in the channel formation region can be lower than or equal to 10 aA ($1\times10^{-17}$ A), preferably lower than or equal to 1 aA ($1\times10^{-18}$ A), further preferably lower than or equal to 10 zA ($1\times10^{-20}$ A), still further preferably lower than or equal to 1 zA ($1\times10^{-21}$ A), yet further preferably lower than or equal to 100 yA ($1\times10^{-22}$ A). Since the carrier concentration of the metal oxide in the OS transistor is low, the off-state current remains low even when the temperature of the OS transistor is changed. For example, even when the temperature of the OS transistor is 150° C., the off-state current per micrometer of channel width can be 100 zA.

Note that the off-state current of an n-channel transistor in this specification can be a leakage current that flows between a source and a drain when a gate-source voltage applied to the transistor is lower than the threshold voltage of the transistor. Furthermore, the off-state current can be a leakage current that flows when the transistor is in an off state.

As illustrated in FIG. 1A, the transistor M1 may have a structure with a back gate. Although a place to which the back gate of the transistor M1 is electrically connected is not specifically illustrated in FIG. 1A, the place to which the back gate of the transistor M1 is electrically connected may be freely determined in design stage of the circuit 20. For example, with a structure in which the gate and the back gate of the transistor M1 are electrically connected to each other, the amount of current flowing through the transistor M1 in an on state can be increased. Furthermore, for example, with a structure in which the back gate of the transistor M1 is provided with a wiring for electrical connection to an external circuit, the threshold voltage of the transistor M1 can be varied when a potential is applied to the back gate of the transistors M1 by the external circuit. Note that the transistor M1 may have a structure without a back gate.

The operational amplifier OP1 is preferably a circuit formed through a CMOS (complementary type MOS) process. For the CMOS process, a transistor in which single crystal silicon, polycrystalline silicon, or microcrystalline silicon is included in a channel formation region (hereinafter referred to as a Si transistor) can be used. In particular, since a Si transistor has high field-effect mobility and high reliability, it is preferable to use a Si transistor in the circuit structure of the operational amplifier OP1.

Alternatively, the operational amplifier OP1 may be a single-polarity circuit including an OS transistor. Note that as for the metal oxide included in the channel formation region of the OS transistor, n-type semiconductors of a metal oxide containing indium (e.g., In oxide) and a metal oxide containing zinc (e.g., Zn oxide) have been manufactured but p-type semiconductors thereof are difficult to manufacture in terms of mobility and reliability. Therefore, in the case where the operational amplifier OP1 is formed using an OS transistor, the operational amplifier OP1 is designed as a single-polarity circuit. In this case, at the time of manufacturing the circuit 20, the operational amplifier OP1 can be formed at the same time as the transistor M1; thus, the manufacturing time of the circuit 20 can be shortened.

Alternatively, the operational amplifier OP1 may have a circuit structure in which an OS transistor is used as an n-channel transistor and a Si transistor is used as a p-channel transistor.

Note that in this specification and the like, an "operational amplifier" can be replaced with a "differential amplifier circuit".

The input terminal IT is electrically connected to an inverting input terminal of the operational amplifier OP1, a first terminal of the transistor M1, and the gate of the transistor M1, and the output terminal OT is electrically connected to an output terminal of the operational amplifier OP1 and a second terminal of the transistor M1. A non-inverting input terminal of the operational amplifier OP1 is electrically connected to a wiring GNDL.

The wiring GNDL is a wiring having a function of supplying a constant voltage. The constant voltage can be, for example, a ground potential (sometimes referred to as GND). The constant voltage supplied by the wiring GNDL may be a voltage other than the ground potential. In this description, the constant voltage supplied by the wiring GNDL is the ground potential.

As illustrated in FIG. 1A, the transistor M1 has a diode-connected structure. Thus, the circuit 20 in FIG. 1A can be an equivalent circuit of a circuit 10 illustrated in FIG. 1B.

The circuit 10 is a circuit in which the transistor M1 of the circuit 20 is replaced with a diode element DE. An input terminal of the diode element DE is electrically connected to the input terminal IT and the inverting input terminal of the operational amplifier OP1, and an output terminal of the diode element DE is electrically connected to the output terminal OT and the output terminal of the operational amplifier OP1.

Figure 1B:
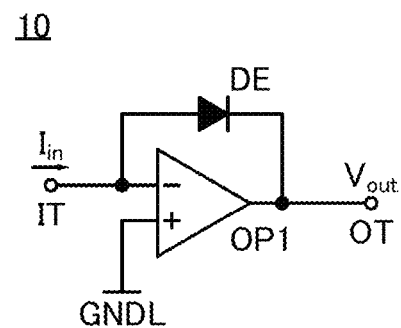

As illustrated in FIG. 1B, the circuit 10 has a structure of a logarithmic conversion circuit. In the case where the diode element DE has ideal pn junction and a large forward voltage is applied thereto, an output voltage $V_{out}$ obtained when an input current $I_{in}$ is input from the input terminal IT can be represented by the following equation.

$$V_{out} = -\frac{kT}{q}\ln\frac{I_{in}}{I_0} \qquad \text{[Equation 1]}$$

Note that k represents the Boltzmann constant, T represents the absolute temperature, q represents a unit charge, and $I_0$ represents the amount of saturation current.

As shown in the above equation, when the circuit 10 is used, the output voltage $V_{out}$ can be represented as a linear expression in which a logarithm of the input current $I_{in}$ is a variable. That is, the input current $I_{in}$ can be measured by utilizing a voltage range of forward current-voltage characteristics of the diode.

The lower limit of current values that can be measured is determined by current-voltage characteristics of the diode element DE. For example, in the case where a pn-junction diode, a bipolar diode, or the like is used as the diode element DE of the circuit 10, the range of a current that can be measured by the circuit 10 is approximately greater than or equal to 1.0 pA ($1.0 \times 10^{-12}$ A) and less than or equal to 10 mA. Therefore, it is not preferable to use the circuit 10 of this case to measure a current less than 1.0 fA. Moreover, in the case where a pn-junction diode, a bipolar diode, or the like is used as the diode element DE of the circuit 10, the current-voltage characteristics of the diode also depend on the temperature as shown by the above equation; therefore, the current measurement may be affected by an environmental temperature.

Here, as in the circuit 20 in FIG. 1A, a diode-connected transistor M1 is considered as the diode element DE.

Figure 2:
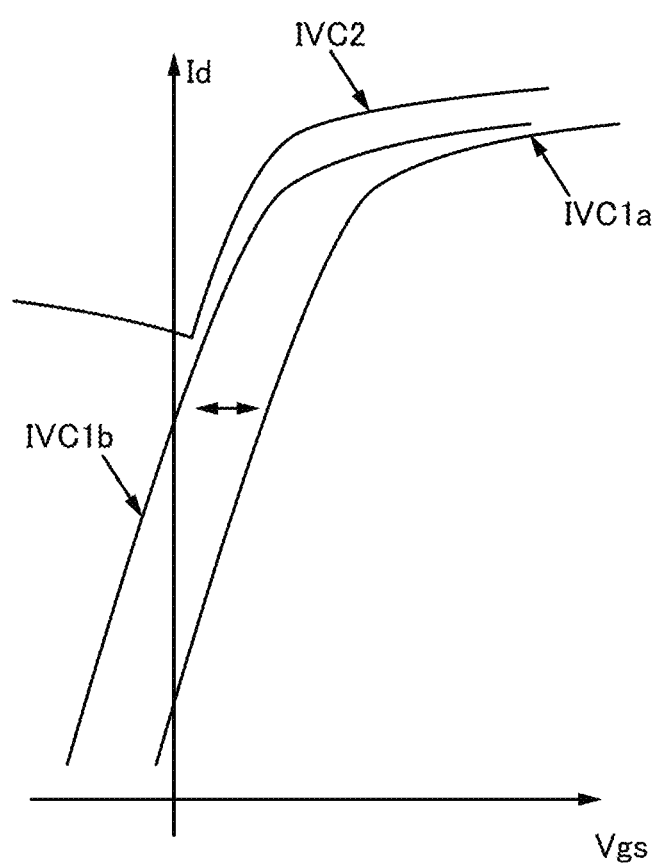
FIG. 2 is a diagram showing current-voltage characteristics of a transistor.

First, advantages in the case of using an OS transistor as the transistor M1 are described. FIG. 2 is a schematic diagram showing an example of the characteristics of a drain current Id and a gate-source voltage Vgs of each of the OS transistor and the Si transistor, and the OS transistor shows characteristics IVC1a and the Si transistor shows characteristics IVC2. Note that the drain current Id is shown logarithmically, and the gate-source voltage Vgs is shown linearly. As shown in FIG. 2, the off-state current of the OS transistor is smaller than the off-state current of the Si transistor.

Specifically, the off-state current per micrometer of channel width of the OS transistor can be less than or equal to 10 aA ($1.0 \times 10^{-17}$ A), further preferably less than or equal to 100 yA ($1.0 \times 10^{-22}$ A). Therefore, the use of the OS transistor as the transistor M1 enables the off-state current to flow from the input terminal IT to the output terminal OT of the circuit 20, so that the output voltage $V_{out}$ corresponding to the off-state current can be output from the output terminal OT.

In other words, the off-state current flowing through the transistor M1 in the circuit 20 in FIG. 1A can be smaller than a current flowing in the forward direction of the diode element DE (pn-junction diode, bipolar transistor, or the like) in the circuit 10 in FIG. 1B; thus, a current with a lower measurement limit can be measured by the circuit 20 in FIG. 1A than by the circuit 10 in FIG. 1B.

In the case where the transistor M1 is a transistor including a back gate, the threshold voltage of the transistor M1 is varied by application of a desired potential to the back gate, so that the characteristics IVC1a can be shifted to characteristics IVC1b and the drain current Id at the time when the gate-source voltage Vgs of the transistor M1 is 0 V can be changed, as shown in FIG. 2. That is, while the transistor M1 remains in an off state, the threshold voltage of the transistor M1 can be varied, whereby the off-state current can be changed. When the threshold voltage of the transistor M1 is varied, the off-state current per micrometer of channel width thereof can be less than or equal to 1.0 fA ($1.0 \times 10^{-15}$ A), preferably less than or equal to 1.0 pA ($1.0 \times 10^{-12}$ A), further preferably less than or equal to 1.0 nA ($1.0 \times 10^{-9}$ A), still further preferably less than or equal to 1.0 μA ($1.0 \times 10^{-6}$ A), for example.

In addition, a change in the off-state current of the OS transistor due to temperature change is small as compared to that of the Si transistor. Thus, current measurement can be performed more stably with respect to temperature by the circuit 20 including the transistor M1 than by the circuit 10 including the diode element DE (pn-junction diode, bipolar transistor, or the like).

Figure 1C:
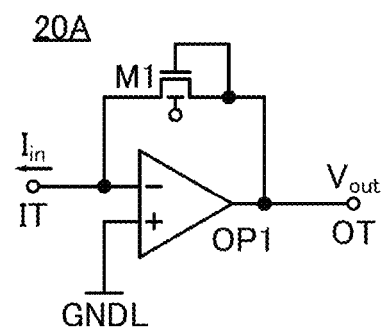

Note that the semiconductor device of one embodiment of the present invention is not limited to the circuit 20 illustrated in FIG. 1A, and the circuit structure can be changed depending on the situation. For example, electrical connection of the gate of the transistors M1 in the circuit 20 in FIG. 1A may be changed as illustrated in FIG. 1C. In a circuit 20A illustrated in FIG. 1C, the gate of the transistor M1 is electrically connected not to the first terminal but to the second terminal of the transistor M1. In this case, the transistor M1 functions as a diode element in which a direction in which current flows from the second terminal to the first terminal is a forward direction.

Note that this embodiment can be combined with other embodiments in this specification as appropriate.

Embodiment 2

In this embodiment, a circuit capable of measuring a minute current, which is different from that in FIG. 1A described in the above embodiment, will be described.

Figure 3A:
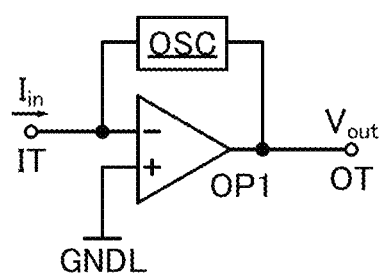
FIG. 3A, FIG. 3B, FIG. 3C, FIG. 3D, FIG. 3E, and FIG. 3F are circuit diagrams illustrating examples of a semiconductor device.

A circuit 21 illustrated in FIG. 3A is a circuit in which the transistor M1 of the circuit 20 in FIG. 1A is replaced with a circuit OSC. A first terminal of the circuit OSC is electrically connected to the input terminal IT and the inverting input terminal of the operational amplifier OP1, and a second terminal of the circuit OSC is electrically connected to the output terminal OT and the output terminal of the operational amplifier OP1.

The circuit OSC is a circuit including an OS transistor, and a current flowing between the first terminal and the second terminal of the circuit OSC can be less than or equal to 1.0 pA ($1.0 \times 10^{-6}$ A), preferably less than or equal to 1.0 pA ($1.0 \times 10^{-12}$ A), further preferably less than or equal to 1.0 aA ($1.0 \times 10^{-18}$ A), still further preferably 1.0 zA ($1.0 \times 10^{-21}$ A), yet further preferably 100 yA ($1.0 \times 10^{-22}$ A).

Figure 3B:
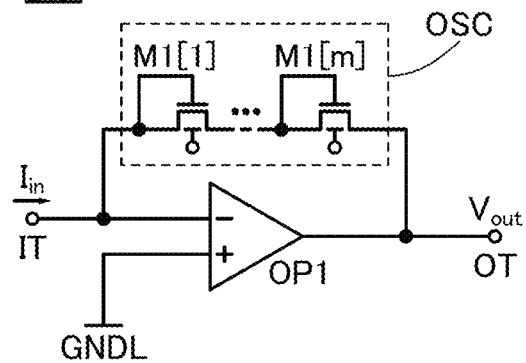

As a specific structure of the circuit OSC, the circuit OSC illustrated in FIG. 3B can be used, for example. FIG. 3B illustrates a circuit 21A that is an example of the circuit 21 and the circuit OSC included in the circuit 21A includes transistors M1[1] to M1[m] (m is an integer of 2 or more).

In the circuit OSC in FIG. 3B, the transistors M1[1] to M1[m] each have a diode-connected structure, and the transistors M1[1] to M1[m] are electrically connected in series. One end of the transistors M1[1] to M1[m] connected in series is electrically connected to the first terminal of the circuit OSC, and the other end of the transistors M1[1] to M1[m] connected in series is electrically connected to the second terminal of the circuit OSC.

Note that all of the transistors M1[1] to M1[m] may be OS transistors. Alternatively, at least one of the transistors M1[1] to M1[m] may be an OS transistor and the others may be transistors other than an OS transistor (e.g., transistors in which a semiconductor such as Si or Ge is used as the active layers, transistors in which a compound semiconductor such as ZnSe, CdS, GaAs, InP, GaN, or SiGe is used as the active layers, transistors in which a carbon nanotube is used as the active layers; or transistors in which an organic semiconductor is used as the active layers).

Figure 3C:
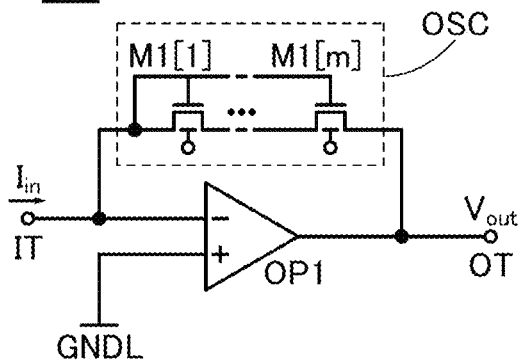

Gates of the transistors M1[1] to M1[m] included in the circuit OSC of the circuit 21A can be electrically connected to each other as illustrated in FIG. 3C. Specifically, in the circuit OSC of a circuit 21B in FIG. 3C, each gate of the transistors M1[1] to M1[m] is electrically connected to a first terminal of the transistor M1[1]. In the circuit OSC, with the electrical connection of the transistors M1[1] to M1[m] illustrated in FIG. 3C, a diode element can be formed using a transistor that substantially has a long channel length.

A circuit CE may further be provided in the circuit OSC of the circuit 21A. In a circuit 21C illustrated in FIG. 3D, the circuit OSC has a structure in which the circuit CE is electrically connected to the transistors M1[1] to M1[m] electrically connected in series. For example, a circuit element can be used as the circuit CE; specifically, a resistor, a diode element, a capacitor, or the like can be used. As the circuit CE, a circuit in which circuit elements are connected in parallel can be used, for example. Although the circuit CE is provided between the transistor M1[m] and the second terminal of the circuit OSC in FIG. 3D, the circuit CE may be provided between the transistor M1[1] and the first terminal of the circuit OSC, or between any transistors of the transistors M1[1] to M1[m] electrically connected in series.

Figure 3D:
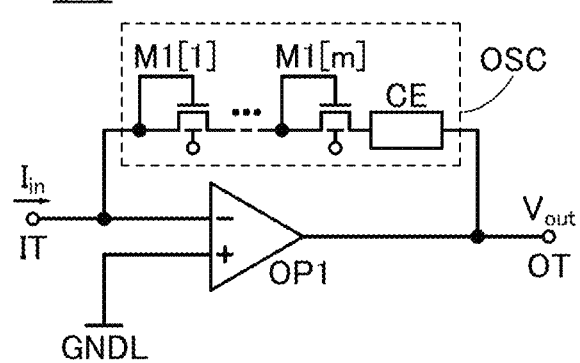
Figure 3E:
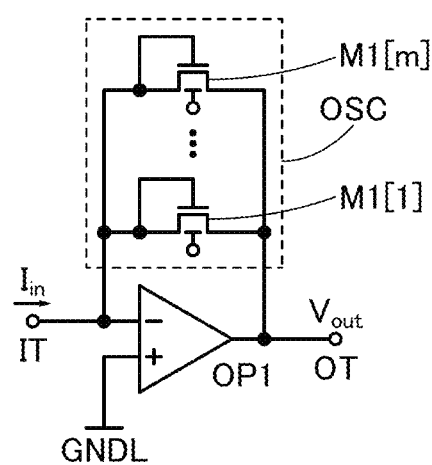

A specific structure of the circuit OSC in FIG. 3A that is different from the circuits OSC in FIG. 3B to FIG. 3D can be, for example, the circuit OSC illustrated in FIG. 3E. FIG. 3D illustrates a circuit 21D as an example of the circuit 21, and the circuit OSC included in the circuit 21D includes the transistors M1[1] to M1[m] (m is an integer of 2 or more), as in the circuit 21A.

In the circuit OSC in FIG. 3E, the transistors M1[1] to M1[m] each have a diode-connected structure, and the transistors M1[1] to M1[m] are electrically connected in parallel. That is, each first terminal and gate of the transistors M1[1] to M1[m] are electrically connected to the first terminal of the circuit OSC, and each second terminal of the transistors M1[1] to M1[m] is electrically connected to the second terminal of the circuit OSC.

Figure 3F:
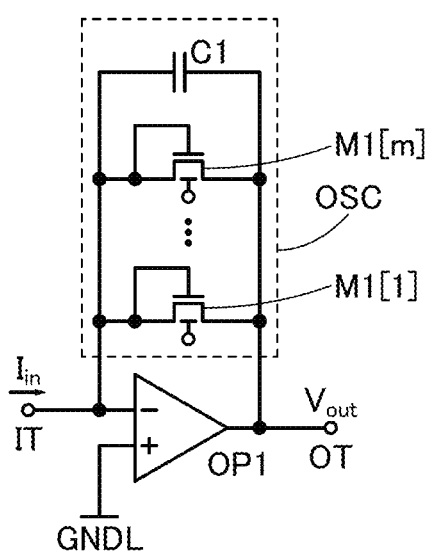

A capacitor C1 may further be provided in the circuit OSC of the circuit 21D. In a circuit 21E illustrated in FIG. 3F, the circuit OSC has a structure in which the capacitor C1 is further electrically connected in parallel to the transistors M1[1] to M1[m] electrically connected in parallel. Specifically, a first terminal of the capacitor C1 is electrically connected to the first terminals and gates of the transistors M1[1] to M1[m] and the inverting input terminal of the operational amplifier OP1, and a second terminal of the capacitor C1 is electrically connected to the second terminals of the transistors M1[1] to M1[m] and the output terminal of the operational amplifier OP1. Since the circuit 21E can retain a potential between the inverting input terminal and the output terminal of the operational amplifier OP1 owing to the capacitor C1, a current flowing between the first terminal and the second terminal of each of the diode-connected transistors M1[1] to M1[m] can flow stably. Although the transistors M1[1] to M1[m] are shown as a plurality of transistors in the circuit 21E in FIG. 3F, the circuit 21E may be formed using not the transistors M1[1] to M1[m] but one transistor M1.

Note that all of the transistors M1[1] to M1[m] are preferably OS transistors.

The amount of minute current can also be measured by the circuits 21, 21A, 21B, 21C, 21D, and 21E illustrated in FIG. 3A to FIG. 3F in a manner similar to that by the circuit 20 described in Embodiment 1.

Note that this embodiment can be combined with any of other embodiments and examples in this specification as appropriate.

Embodiment 3

In this embodiment, a structure of a transistor applicable to the semiconductor device described in the above embodiment, specifically, a structure in which transistors having different electrical characteristics are stacked will be described. With the structure, the degree of flexibility in design of the semiconductor device can be increased. Furthermore, when transistors having different electrical characteristics are stacked, the integration degree of the semiconductor device can be increased.

Figure 4:
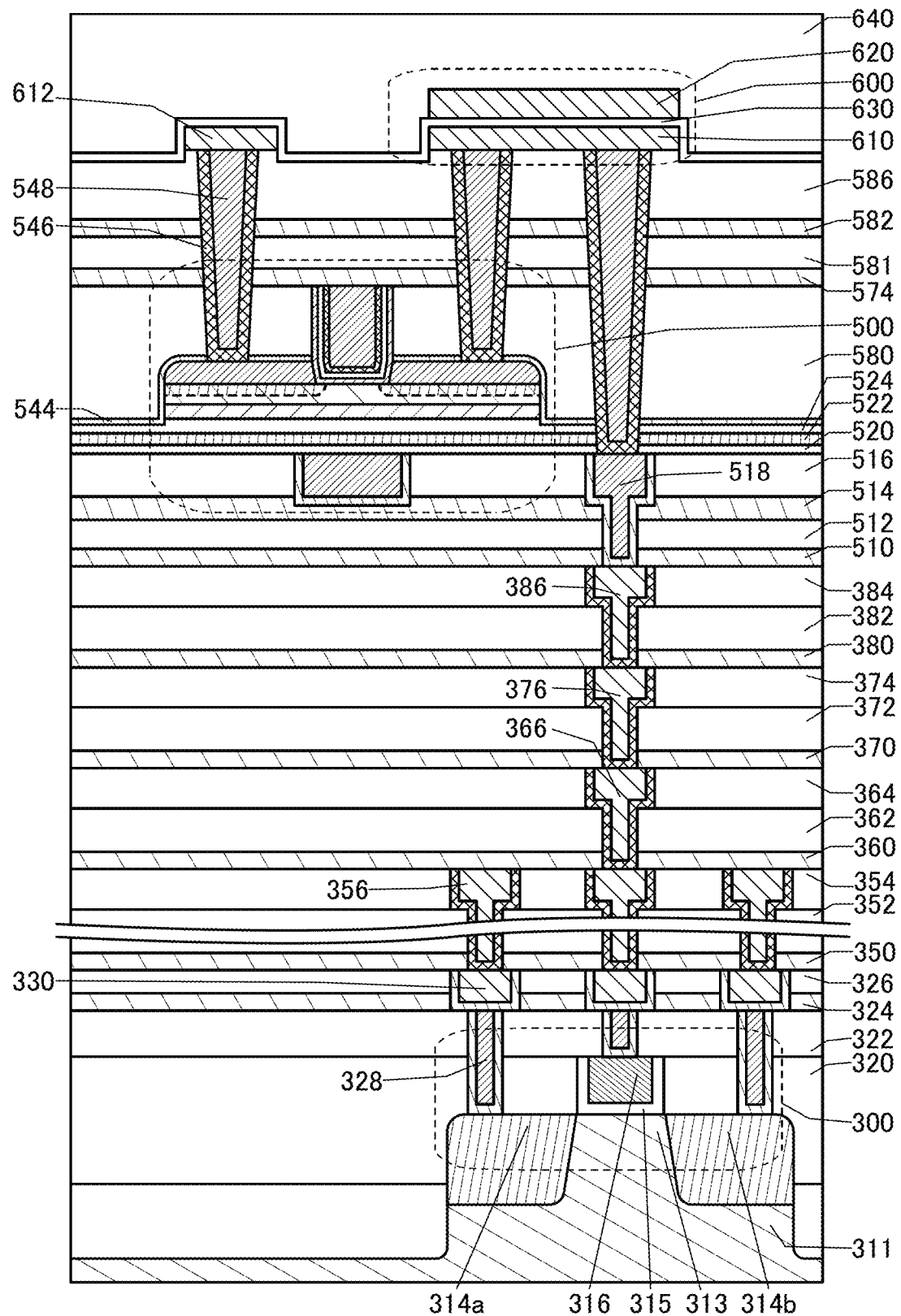
FIG. 4 is a schematic cross-sectional view illustrating the structure of a semiconductor device.
Figure 6A:
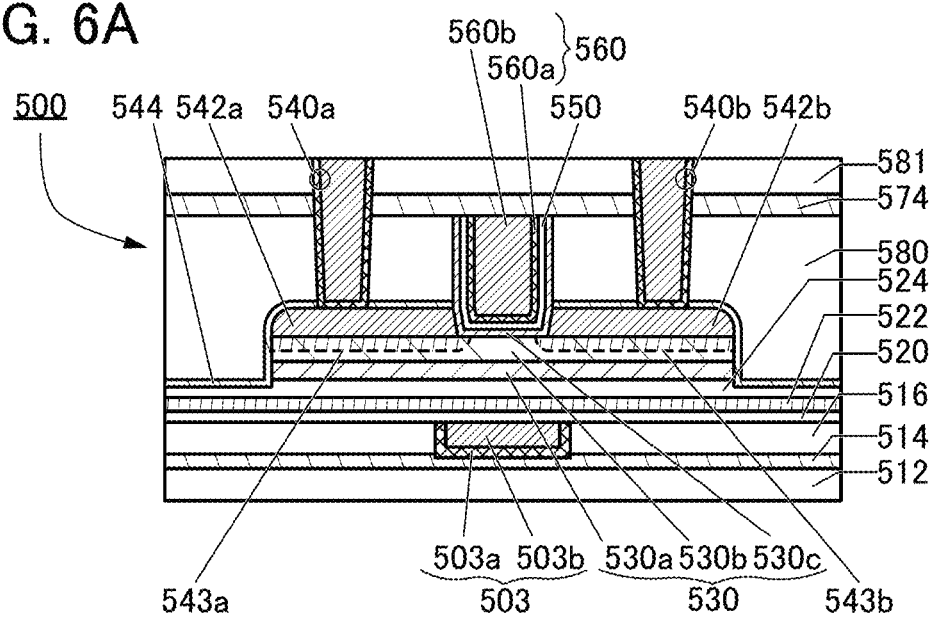
FIG. 6A, FIG. 6B, and FIG. 6C are schematic cross-sectional views illustrating the structure of a semiconductor device.
Figure 6B:
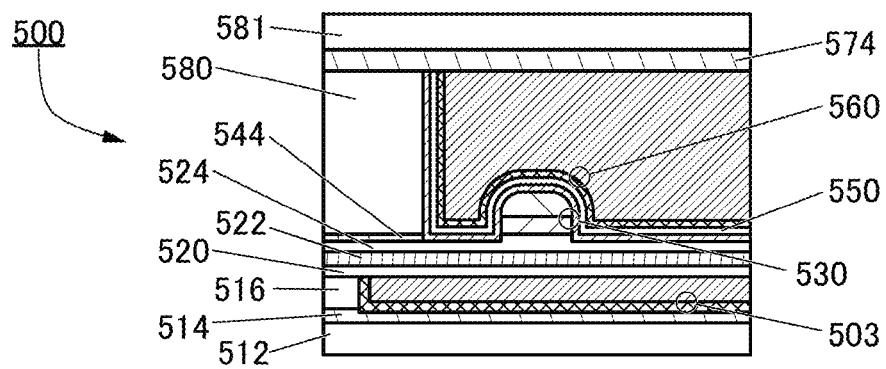
Figure 6C:
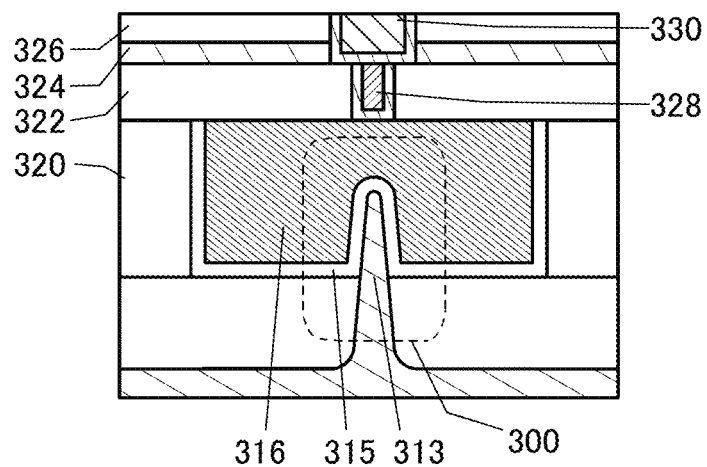

A semiconductor device illustrated in FIG. 4 includes a transistor 300, a transistor 500, and a capacitor 600. FIG. 6A is a cross-sectional view of the transistor 500 in the channel length direction, FIG. 6B is a cross-sectional view of the transistor 500 in the channel width direction, and FIG. 6C is a cross-sectional view of the transistor 300 in the channel width direction.

The transistor 500 is a transistor including a metal oxide in a channel formation region (an OS transistor). Since the off-state current of the transistor 500 is low, when the transistor 500 is used as a write transistor included in a memory cell, written data voltage or charge can be retained for a long time. In other words, the frequency of refresh operation is low or refresh operation is not required; thus, power consumption of the semiconductor device can be reduced.

The semiconductor device described in this embodiment has a structure in which the transistor 500 is provided above the transistor 300, and the capacitor 600 is provided above the transistor 300 and the transistor 500.

The transistor 300 is provided on a substrate 311 and includes a conductor 316, an insulator 315, a semiconductor region 313 that is a part of the substrate 311, and a low-resistance region 314a and a low-resistance region 314b functioning as a source region and a drain region. For example, the transistor 300 can be used as the transistor or the like included in the operational amplifier OP1 in the above embodiment.

In the transistor 300, the top surface and the side surface in the channel width direction of the semiconductor region 313 are covered with the conductor 316 with the insulator 315 therebetween, as illustrated in FIG. 6C. Such a FIN-type transistor 300 can have an increased effective channel width, and thus have improved on-state characteristics. In addition, since contribution of an electric field of a gate electrode can be increased, the off-state characteristics of the transistor 300 can be improved.

Note that the transistor 300 can be either a p-channel transistor or an n-channel transistor.

A region of the semiconductor region 313 where a channel is formed, a region in the vicinity thereof, the low-resistance region 314a and the low-resistance region 314b functioning as the source region and the drain region, and the like preferably contain a semiconductor such as a silicon-based semiconductor, further preferably contain single crystal silicon. Alternatively, the regions may be formed using a material containing Ge (germanium), SiGe (silicon germanium), GaAs (gallium arsenide), GaAlAs (gallium aluminum arsenide), or the like. Silicon whose effective mass is adjusted by applying stress to the crystal lattice and thereby changing the lattice spacing may be used. Alternatively, the transistor 300 may be an HEMT (High Electron Mobility Transistor) with the use of GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to a semiconductor material used for the semiconductor region 313.

The conductor 316 functioning as a gate electrode can be formed using a semiconductor material such as silicon containing an element that imparts n-type conductivity, such as arsenic or phosphorus, or an element that imparts p-type conductivity, such as boron, or a conductive material such as a metal material, an alloy material, or a metal oxide material.

Note that the work function depends on a material used for a conductor; therefore, selecting the material for the conductor can adjust the threshold voltage of the transistor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Figure 5:
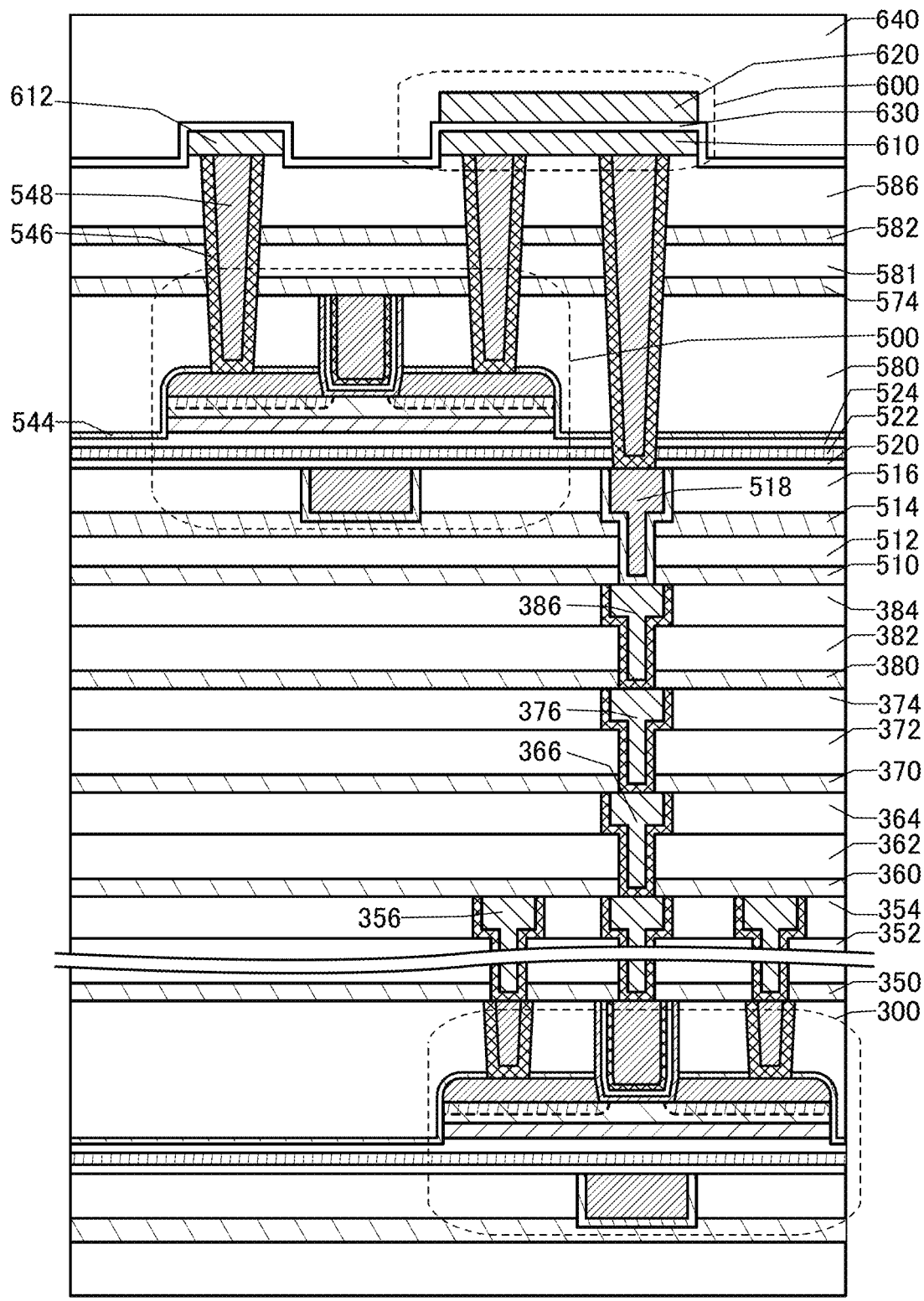
FIG. 5 is a schematic cross-sectional view illustrating the structure of a semiconductor device.

Note that the transistor 300 illustrated in FIG. 4 is an example and the structure is not limited thereto; an appropriate transistor can be used in accordance with a circuit structure or a driving method. For example, when the semiconductor device is a single-polarity circuit using only OS transistors (which represent transistors having the same polarity, e.g., only n-channel transistors), the transistor 300 has a structure similar to that of the transistor 500 using an oxide semiconductor, as illustrated in FIG. 5. Note that the details of the transistor 500 are described later.

An insulator 320, an insulator 322, an insulator 324, and an insulator 326 are stacked in this order to cover the transistor 300.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, aluminum nitride, or the like is used, for example.

Note that in this specification, silicon oxynitride refers to a material that has a higher oxygen content than a nitrogen content, and silicon nitride oxide refers to a material that has a higher nitrogen content than an oxygen content. Moreover, in this specification, aluminum oxynitride refers to a material that has a higher oxygen content than a nitrogen content, and aluminum nitride oxide refers to a material that has a higher nitrogen content than an oxygen content.

The insulator 322 may have a function of a planarization film for reducing a level difference caused by the transistor 300 or the like provided below the insulator 322. For example, the top surface of the insulator 322 may be planarized by planarization treatment using a chemical mechanical polishing (CMP) method or the like to improve planarity.

In addition, for the insulator 324, it is preferable to use a film having a barrier property that prevents diffusion of hydrogen or impurities from the substrate 311, the transistor 300, or the like to a region where the transistor 500 is provided.

For the film having a barrier property against hydrogen, silicon nitride formed by a CVD method can be used, for example. Here, diffusion of hydrogen to a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

The amount of released hydrogen can be analyzed by thermal desorption spectroscopy (TDS) or the like, for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the relative permittivity of the insulator 326 is preferably lower than 4, further preferably lower than 3. The relative permittivity of the insulator 326 is, for example, preferably 0.7 times or less, further preferably 0.6 times or less the dielectric constant of the insulator 324. When a material with a low permittivity is used as an interlayer film, the parasitic capacitance generated between wirings can be reduced.

In addition, a conductor 328, a conductor 330, and the like that are connected to the capacitor 600 or the transistor 500 are embedded in the insulator 320, the insulator 322, the insulator 324, and the insulator 326. Note that the conductor 328 and the conductor 330 have a function of a plug or a wiring. A plurality of conductors having a function of a plug or a wiring are collectively denoted by the same reference numeral in some cases. Moreover, in this specification and the like, a wiring and a plug connected to the wiring may be a single component. That is, in some cases, part of a conductor functions as a wiring or part of a conductor functions as a plug.

As a material for each of the plugs and wirings (the conductor 328, the conductor 330, and the like), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 4, an insulator 350, an insulator 352, and an insulator 354 are stacked in this order. Furthermore, a conductor 356 is formed in the insulator 350, the insulator 352, and the insulator 354. The conductor 356 has a function of a plug or a wiring that is connected to the transistor 300. Note that the conductor 356 can be provided using a material similar to those for the conductor 328 and the conductor 330.

Note that for example, an insulator having a barrier property against hydrogen is preferably used as the insulator 350, like the insulator 324. Furthermore, the conductor 356 preferably contains a conductor having a barrier property against hydrogen. In particular, the conductor having a barrier property against hydrogen is formed in an opening of the insulator 350 having a barrier property against hydrogen. With the structure, the transistor 300 and the transistor 500 can be separated by the barrier layer, so that the diffusion of hydrogen from the transistor 300 to the transistor 500 can be inhibited.

Note that for the conductor having a barrier property against hydrogen, tantalum nitride is preferably used, for example. Stacking tantalum nitride and tungsten having high conductivity can inhibit the diffusion of hydrogen from the transistor 300 while the conductivity of a wiring is ensured. In that case, the tantalum nitride layer having a barrier property against hydrogen is preferably in contact with the insulator 350 having a barrier property against hydrogen.

A wiring layer may be provided over the insulator 354 and the conductor 356. For example, in FIG. 4, an insulator 360, an insulator 362, and an insulator 364 are stacked in this order. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

Note that for example, an insulator having a barrier property against hydrogen is preferably used as the insulator 360, like the insulator 324. Furthermore, the conductor 366 preferably contains a conductor having a barrier property against hydrogen. In particular, the conductor having a barrier property against hydrogen is preferably formed in an opening portion of the insulator 360 having a barrier property against hydrogen. With the structure, the transistor 300 and the transistor 500 can be separated by the barrier layer, so that the diffusion of hydrogen from the transistor 300 to the transistor 500 can be inhibited.

A wiring layer may be provided over the insulator 364 and the conductor 366. For example, in FIG. 4, an insulator 370, an insulator 372, and an insulator 374 are stacked in this order. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

Note that for example, an insulator having a barrier property against hydrogen is preferably used as the insulator 370, like the insulator 324. Furthermore, the conductor 376 preferably contains a conductor having a barrier property against hydrogen. In particular, the conductor having a barrier property against hydrogen is preferably formed in an opening portion of the insulator 370 having a barrier property against hydrogen. With the structure, the transistor 300 and the transistor 500 can be separated by the barrier layer, so that the diffusion of hydrogen from the transistor 300 to the transistor 500 can be inhibited.

A wiring layer may be provided over the insulator 374 and the conductor 376. For example, in FIG. 4, an insulator 380, an insulator 382, and an insulator 384 are stacked in this order. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

Note that for example, an insulator having a barrier property against hydrogen is preferably used as the insulator 380, like the insulator 324. Furthermore, the conductor 386 preferably contains a conductor having a barrier property against hydrogen. In particular, the conductor having a barrier property against hydrogen is preferably formed in an opening portion of the insulator 380 having a barrier property against hydrogen. With the structure, the transistor 300 and the transistor 500 can be separated by the barrier layer, so that the diffusion of hydrogen from the transistor 300 to the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are stacked in this order over the insulator 384. A substance having a barrier property against oxygen or hydrogen is preferably used for any of the insulator 510, the insulator 512, the insulator 514, and the insulator 516.

For example, for the insulator 510 and the insulator 514, it is preferable to use a film having a barrier property that prevents diffusion of hydrogen or impurities from the substrate 311, a region where the transistor 300 is provided, or the like into the region where the transistor 500 is provided. Therefore, a material similar to that for the insulator 324 can be used.

For the film having a barrier property against hydrogen, silicon nitride formed by a CVD method can be used, for example. Here, diffusion of hydrogen to a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

In addition, for the film having a barrier property against hydrogen, a metal oxide such as aluminum oxide, hafnium oxide, or tantalum oxide is preferably used for the insulator 510 and the insulator 514, for example.

In particular, aluminum oxide has an excellent blocking effect that prevents the passage of both oxygen and impurities such as hydrogen and moisture which are factors of a change in electrical characteristics of the transistor. Accordingly, aluminum oxide can prevent mixing of impurities such as hydrogen and moisture into the transistor 500 in a manufacturing process and after manufacturing of the transistor. In addition, release of oxygen from the oxide included in the transistor 500 can be inhibited. Therefore, aluminum oxide is suitably used for a protective film of the transistor 500.

In addition, for the insulator 512 and the insulator 516, a material similar to that for the insulator 320 can be used, for example. Furthermore, when a material with a comparatively low permittivity is used for these insulators, parasitic capacitance generated between wirings can be reduced. A silicon oxide film, a silicon oxynitride film, or the like can be used for the insulator 512 and the insulator 516, for example.

Furthermore, a conductor 518, a conductor included in the transistor 500 (e.g., a conductor 503), and the like are embedded in the insulator 510, the insulator 512, the insulator 514, and the insulator 516. Note that the conductor 518 has a function of a plug or a wiring that is connected to the capacitor 600 or the transistor 300. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With the structure, the transistor 300 and the transistor 500 can be separated by the layer having a barrier property against oxygen, hydrogen, and water; thus, diffusion of hydrogen from the transistor 300 to the transistor 500 can be inhibited.

The transistor 500 is provided above the insulator 516.

As illustrated in FIG. 6A and FIG. 6B, the transistor 500 includes the conductor 503 positioned to be embedded in the insulator 514 and the insulator 516, an insulator 520 positioned over the insulator 516 and the conductor 503, an insulator 522 positioned over the insulator 520, an insulator 524 positioned over the insulator 522, an oxide 530a positioned over the insulator 524, an oxide 530b positioned over the oxide 530a, a conductor 542a and a conductor 542b positioned apart from each other over the oxide 530b, an insulator 580 that is positioned over the conductor 542a and the conductor 542b and is provided with an opening formed to overlap with a region between the conductor 542a and the conductor 542b, an oxide 530c positioned on a bottom and a side surface of the opening, an insulator 550 positioned on a formation surface of the oxide 530c, and a conductor 560 positioned on a formation surface of the insulator 550.

As illustrated in FIG. 6A and FIG. 6B, an insulator 544 is preferably provided between the insulator 580 and the oxide 530a, the oxide 530b, the conductor 542a, and the conductor 542b. As illustrated in FIG. 6A and FIG. 6B, the conductor 560 preferably includes a conductor 560a provided on the inner side of the insulator 550 and a conductor 560b embedded inside the conductor 560a. As illustrated in FIG. 6A and FIG. 6B, an insulator 574 is preferably provided over the insulator 580, the conductor 560, and the insulator 550.

Note that in the following description, the oxide 530a, the oxide 530b, and the oxide 530c are sometimes collectively referred to as an oxide 530.

Note that although a structure of the transistor 500 in which three layers of the oxide 530a, the oxide 530b, and the oxide 530c are stacked in a region where a channel is formed and its vicinity is shown, the present invention is not limited thereto. For example, a single layer of the oxide 530b, a two-layer structure of the oxide 530b and the oxide 530a, a two-layer structure of the oxide 530b and the oxide 530c, or a stacked-layer structure of four or more layers may be employed. Although the conductor 560 is shown to have a stacked-layer structure of two layers in the transistor 500, the present invention is not limited thereto. For example, the conductor 560 may have a single-layer structure or a stacked-layer structure of three or more layers. Moreover, the transistor 500 illustrated in FIG. 4 and FIG. 6A is an example and the structure is not limited thereto; an appropriate transistor is used in accordance with a circuit configuration or a driving method.

Here, the conductor 560 functions as a gate electrode of the transistor, and the conductor 542a and the conductor 542b each function as a source electrode or a drain electrode. As described above, the conductor 560 is formed to be embedded in the opening of the insulator 580 and the region between the conductor 542a and the conductor 542b. The positions of the conductor 560, the conductor 542a, and the conductor 542b with respect to the opening of the insulator 580 are selected in a self-aligned manner. That is, in the transistor 500, the gate electrode can be positioned between the source electrode and the drain electrode in a self-aligned manner. Therefore, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 does not have a region overlapping with the conductor 542a or the conductor 542b. Thus, parasitic capacitance formed between the conductor 560 and each of the conductor 542a and the conductor 542b can be reduced. As a result, the switching speed of the transistor 500 can be improved, and the transistor 500 can have high frequency characteristics.

The conductor 560 sometimes functions as a first gate (also referred to as top gate) electrode. In addition, the conductor 503 sometimes functions as a second gate (also referred to as bottom gate) electrode. In that case, the threshold voltage of the transistor 500 can be controlled by changing a potential applied to the conductor 503 independently of a potential applied to the conductor 560. In particular, the threshold voltage of the transistor 500 can be higher than 0 V and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to overlap with the oxide 530 and the conductor 560. Thus, in the case where potentials are applied to the conductor 560 and the conductor 503, an electric field generated from the conductor 560 and an electric field generated from the conductor 503 are connected, so that the channel formation region formed in the oxide 530 can be covered. In this specification and the like, a transistor structure in which a channel formation region is electrically surrounded by electric fields of a first gate electrode and a second gate electrode is referred to as a surrounded channel (S-channel) structure.

In addition, the conductor 503 has a structure similar to that of the conductor 518; a conductor 503a is formed in contact with an inner wall of an opening in the insulator 514 and the insulator 516, and a conductor 503b is formed on the inner side. Note that although the transistor 500 having a structure in which the conductor 503a and the conductor 503b are stacked is shown, the present invention is not limited thereto. For example, the conductor 503 may be provided as a single layer or to have a stacked-layer structure of three or more layers.

Here, for the conductor 503a, a conductive material that has a function of inhibiting diffusion of impurities such as a hydrogen atom, a hydrogen molecule, a water molecule, and a copper atom (through which the impurities are less likely to pass) is preferably used. Alternatively, it is preferable to use a conductive material that has a function of inhibiting diffusion of oxygen (e.g., at least one of an oxygen atom, an oxygen molecule, and the like) (through which oxygen is less likely to pass). Note that in this specification, a function of inhibiting diffusion of impurities or oxygen means a function of inhibiting diffusion of any one or all of the impurities and oxygen.

For example, when the conductor 503a has a function of inhibiting diffusion of oxygen, a reduction in conductivity of the conductor 503b due to oxidation can be inhibited.

In addition, in the case where the conductor 503 also functions as a wiring, a conductive material with high conductivity that contains tungsten, copper, or aluminum as its main component is preferably used for the conductor 503b. In that case, the conductor 503b is not necessarily provided. Note that the conductor 503b is shown as a single layer but may have a stacked-layer structure, for example, a stack of the above conductive material and titanium or titanium nitride.

The insulator 520, the insulator 522, and the insulator 524 have a function of a second gate insulating film, and the insulator 550 has a function of a first gate insulating film Here, as the insulator 524 in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced and the reliability of the transistor 500 can be improved.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably in a range of higher than or equal to 100° C. and lower than or equal to 700° C., or higher than or equal to 100° C. and lower than or equal to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of $V_OH$ is cut occurs, i.e., a reaction of "$V_OH \to V_O + H$" occurs. Part of hydrogen generated at this time is bonded to oxygen to be H$_2$O, and removed from the oxide 530 or an insulator in the vicinity of the oxide 530 in some cases. Some hydrogen is diffused in or gettered by the conductor 542*a* and/or the conductor 542*b* in some cases.

For the microwave treatment, for example, an apparatus including a power supply that generates high-density plasma or an apparatus including a power supply that applies RF to the substrate side is suitably used. For example, the use of an oxygen-containing gas and high-density plasma enables high-density oxygen radicals to be generated, and application of the RF to the substrate side allows the oxygen radicals generated by the high-density plasma to be efficiently introduced into the oxide 530 or an insulator in the vicinity of the oxide 530. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate (O$_2$/(O$_2$+Ar)) is lower than or equal to 50%, preferably higher than or equal to 10% and lower than or equal to 30%.

In a manufacturing process of the transistor 500, the heat treatment is preferably performed with the surface of the oxide 530 exposed. The heat treatment is performed at higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies ($V_O$). The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that the oxygen adding treatment performed on the oxide 530 can promote a reaction in which oxygen vacancies in the oxide 530 are filled with supplied oxygen, i.e., a reaction of "$V_O + O \to$ null". Furthermore, hydrogen remaining in the oxide 530 reacts with supplied oxygen, so that the hydrogen can be removed as H$_2$O (dehydration). This can inhibit recombination of hydrogen remaining in the oxide 530 with oxygen vacancies and formation of $V_OH$.

In the case where the insulator 524 includes an excess-oxygen region, it is preferable that the insulator 522 have a function of inhibiting diffusion of oxygen (e.g., an oxygen atom, an oxygen molecule, or the like) (through which oxygen is less likely to pass).

The insulator 522 preferably has a function of inhibiting diffusion of oxygen or impurities, in which case diffusion of oxygen contained in the oxide 530 to the insulator 520 side is prevented. Furthermore, the conductor 503 can be inhibited from reacting with oxygen contained in the insulator 524 or the oxide 530.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate (SrTiO$_3$), or (Ba,Sr)TiO$_3$ (BST) are preferably used, for example. As miniaturization and high integration of transistors progress, a problem such as leakage current might arise because of a thinner gate insulating film. When a high-k material is used for an insulator functioning as the gate insulating film, a gate potential during operation of the transistor can be reduced while the physical thickness is maintained.

It is particularly preferable to use an insulator containing an oxide of one or both of aluminum and hafnium, which is an insulating material having a function of inhibiting diffusion of impurities, oxygen, and the like (through which oxygen is less likely to pass). Aluminum oxide, hafnium oxide, an oxide containing aluminum and hafnium (hafnium aluminate), or the like is preferably used as the insulator containing an oxide of one or both of aluminum and hafnium. In the case where the insulator 522 is formed using such a material, the insulator 522 functions as a layer that inhibits release of oxygen from the oxide 530 and mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. The insulator over which silicon oxide, silicon oxynitride, or silicon nitride is stacked may be used.

In addition, it is preferable that the insulator 520 be thermally stable. For example, silicon oxide and silicon oxynitride are suitable because they are thermally stable. Furthermore, when an insulator which is a high-k material is combined with silicon oxide or silicon oxynitride, the insulator 520 having a stacked-layer structure that has thermal stability and a high relative permittivity can be obtained.

Note that the transistor 500 in FIG. 6A and FIG. 6B includes the insulator 520, the insulator 522, and the insulator 524 as the second gate insulating film having a three-layer structure; however, the second gate insulating film may have a single-layer structure, a two-layer structure, or a stacked-layer structure of four or more layers. In such cases, without limitation to a stacked-layer structure formed of the same material, a stacked-layer structure formed of different materials may be employed.

In the transistor 500, a metal oxide functioning as an oxide semiconductor is preferably used as the oxide 530 including the channel formation region. For example, as the oxide 530, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. The In-M-Zn oxide that can be used as the oxide 530 is particularly preferably a CAAC-OS or a CAC-OS each of which will be described in Embodiment 4. Furthermore, as the oxide 530, an In—Ga oxide or an In—Zn oxide may be used.

Furthermore, a metal oxide with a low carrier concentration is preferably used for the transistor 500. In order to reduce the carrier concentration of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. As examples of the impurities in the metal oxide, hydrogen, nitrogen, alkali metal, alkaline earth metal, iron, nickel, silicon, and the like are given.

In particular, hydrogen contained in a metal oxide reacts with oxygen bonded to a metal atom to be water, and thus forms oxygen vacancies in the metal oxide in some cases. In the case where hydrogen enters an oxygen vacancy in the oxide 530, the oxygen vacancy and the hydrogen are bonded to each other to form $V_O H$ in some cases. The $V_O H$ serves as a donor and an electron that is a carrier is generated in some cases. In other cases, bonding of part of hydrogen to oxygen bonded to a metal atom generates an electron serving as a carrier. Thus, a transistor using a metal oxide containing much hydrogen is likely to have normally-on characteristics. Moreover, hydrogen in a metal oxide easily moves by stress such as heat and an electric field; thus, the reliability of a transistor may be low when the metal oxide contains a plenty of hydrogen. In one embodiment of the present invention, $V_O H$ in the oxide 530 is preferably reduced as much as possible so that the oxide 530 becomes a highly purified intrinsic or substantially highly purified intrinsic oxide. It is important to remove impurities such as moisture and hydrogen in a metal oxide (sometimes described as dehydration or dehydrogenation treatment) and to compensate for oxygen vacancies by supplying oxygen to the metal oxide (sometimes described as oxygen supplying treatment) to obtain a metal oxide whose $V_O H$ is reduced enough. When a metal oxide with a sufficiently low concentration of impurities such as $V_O H$ is used for a channel formation region of a transistor, the transistor can have stable electrical characteristics.

A defect in which hydrogen has entered an oxygen vacancy can function as a donor of the metal oxide. However, it is difficult to evaluate the defects quantitatively. Thus, the metal oxide is evaluated by carrier concentration, not by donor concentration, in some cases. Therefore, in this specification and the like, the carrier concentration assuming the state where an electric field is not applied is sometimes used, instead of the donor concentration, as the parameter of the metal oxide. That is, "carrier concentration" in this specification and the like can be replaced with "donor concentration" in some cases.

Therefore, when a metal oxide is used as the oxide 530, hydrogen in the metal oxide is preferably reduced as much as possible. Specifically, the hydrogen concentration of the metal oxide, which is measured by secondary ion mass spectrometry (SIMS), is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide with a sufficiently low concentration of impurities such as hydrogen is used for a channel formation region of a transistor, the transistor can have stable electrical characteristics.

In the case where a metal oxide is used as the oxide 530, the carrier concentration of the metal oxide in the channel formation region is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, and yet still further preferably lower than $1\times10^{12}$ cm$^{-3}$. Note that the lower limit of the carrier concentration of the metal oxide in the channel formation region is not particularly limited and can be, for example, $1\times10^{-9}$ cm$^{-3}$.

When a metal oxide is used as the oxide 530, contact between the conductor 542a (the conductor 542b) and the oxide 530 may make oxygen in the oxide 530 diffuse into the conductor 542a (the conductor 542b), resulting in oxidation of the conductor 542a (the conductor 542b). It is highly possible that oxidation of the conductor 542a (the conductor 542b) lowers the conductivity of the conductor 542a (the conductor 542b). Note that diffusion of oxygen in the oxide 530 into the conductor 542a (the conductor 542b) can be rephrased as absorption of oxygen in the oxide 530 by the conductor 542a (the conductor 542b).

When oxygen in the oxide 530 diffuses into the conductor 542a and the conductor 542b, an insulating region is sometimes formed at and near an interface between the conductor 542a and the oxide 530b and at and near an interface between the conductor 542b and the oxide 530b. Since the region contains more oxygen than the conductor 542a and the conductor 542b, the region is assumed to have higher electric resistance than the conductor 542a and the conductor 542b. At this time, the three-layer structure of the conductor 542a and the conductor 542b, the region, and the oxide 530b can be regarded as a three-layer structure formed of a metal, an insulator, and a semiconductor and is sometimes referred to as a MIS (Metal-Insulator-Semiconductor) structure or a diode junction structure that mainly has a MIS structure.

Note that the insulating region is not limited to be formed between the conductor 542a (the conductor 542b) and the oxide 530b; for example, the insulating region may be formed between the conductor 542a (the conductor 542b) and the oxide 530c, between the conductor 542a (the conductor 542b) and the oxide 530b, and between the conductor 542a (the conductor 542b) and the oxide 530c.

The metal oxide functioning as the channel formation region in the oxide 530 has a band gap of more than or equal to 2 eV, preferably more than or equal to 2.5 eV With the use of a metal oxide having such a wide bandgap, the off-state current of the transistor can be reduced.

By including the oxide 530a under the oxide 530b, the oxide 530 can inhibit diffusion of impurities to the oxide 530b from the components formed below the oxide 530a. By including the oxide 530c over the oxide 530b, the oxide 530 can inhibit diffusion of impurities into the oxide 530b from the components formed above the oxide 530c.

Note that the oxide 530 preferably has a stacked-layer structure of oxides that differ in the atomic ratio of metal atoms. Specifically, the atomic ratio of the element M to the constituent elements in the metal oxide used as the oxide 530a is preferably higher than the atomic ratio of the element M to the constituent elements in the metal oxide used as the oxide 530b. In addition, the atomic ratio of the element M to In in the metal oxide used as the oxide 530a is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530a. Moreover, a metal oxide that can be used as the oxide 530a or the oxide 530b can be used as the oxide 530c.

For example, the case where an In—Ga—Zn oxide is used as the oxide 530 is considered. In the case where an In—Ga—Zn oxide having an atomic ratio of In:Ga:Zn=4:2:3 to 4:2:4.1 or a neighborhood thereof is used as the oxide 530b, it is preferable that an In—Ga—Zn oxide having an atomic ratio of In:Ga:Zn=1:3:4 or a neighborhood thereof, or an atomic ratio of In:Ga:Zn=1:1:1 or a neighborhood thereof be used as the oxide 530a. Furthermore, the oxide 530c is preferably an In—Ga—Zn oxide that satisfies any one of the above compositions.

For example, in the case where the atomic ratio of In to the element M in the metal oxide used as the oxide 530a is lower than the atomic ratio of In to the element M in the metal oxide used as the oxide 530b, an In—Ga—Zn oxide having an atomic ratio of In:Ga:Zn=5:1:6 or a neighborhood thereof, In:Ga:Zn=5:1:3 or a neighborhood thereof, In:Ga:Zn=10:1:3 or a neighborhood thereof, or the like can be used as the oxide 530b.

In addition, the energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b.

Here, the energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To change the energy level gradually, the densities of defect states in mixed layers formed at an interface between the oxide 530a and the oxide 530b and an interface between the oxide 530b and the oxide 530c is preferably made low.

Specifically, when the oxide 530a and the oxide 530b or the oxide 530b and the oxide 530c contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used as the oxide 530a and the oxide 530c.

At this time, the oxide 530b serves as a main carrier path. When the oxide 530a and the oxide 530c have the above structures, the densities of defect states at the interface between the oxide 530a and the oxide 530b and the interface between the oxide 530b and the oxide 530c can be made low. Thus, the influence of interface scattering on carrier conduction is small, and the transistor 500 can have a high on-state current.

The conductor 542a and the conductor 542b functioning as the source electrode and the drain electrode are provided over the oxide 530b. For the conductor 542a and conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal element; or the like. For example, it is preferable to use tantalum nitride, titanium nitride, tungsten nitride, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film of tantalum nitride or the like is preferable because it has a barrier property against hydrogen or oxygen.

In addition, although the conductor 542a and the conductor 542b each having a single-layer structure are shown in FIG. 6, a stacked-layer structure of two or more layers may be employed. For example, it is preferable to stack a tantalum nitride film and a tungsten film. Alternatively, a titanium film and an aluminum film may be stacked. Further alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

As illustrated in FIG. 6A, a region 543a and a region 543b are sometimes formed as low-resistance regions in the oxide 530 at and near the interface with the conductor 542a (the conductor 542b). In that case, the region 543a functions as one of a source region and a drain region, and the region 543b functions as the other of the source region and the drain region. Furthermore, the channel formation region is formed in a region between the region 543a and the region 543b.

When the conductor 542a (the conductor 542b) is provided to be in contact with the oxide 530, the oxygen concentration in the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier density of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. At this time, the insulator 544 may be provided to cover the side surface of the oxide 530 and to be in contact with the insulator 524.

A metal oxide containing one kind or two or more kinds selected from hafnium, aluminum, gallium, yttrium, zirconium, tungsten, titanium, tantalum, nickel, germanium, neodymium, lanthanum, magnesium, and the like can be used as the insulator 544. Alternatively, silicon nitride oxide, silicon nitride, or the like can be used for the insulator 544.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542a and the conductor 542b is an oxidation-resistant material or a material that does not significantly lose its conductivity even after absorbing oxygen. Design is appropriately set in consideration of required transistor characteristics.

When the insulator 544 is included, diffusion of impurities such as water and hydrogen contained in the insulator 580 into the oxide 530b through the oxide 530c and the insulator 550 can be inhibited. Furthermore, oxidation of the conductor 560 due to excess oxygen contained in the insulator 580 can be inhibited.

The insulator 550 functions as a first gate insulating film. The insulator 550 is preferably positioned in contact with an inner side (a top surface and a side surface) of the oxide 530c. Like the insulator 524, the insulator 550 is preferably formed using an insulator that contains excess oxygen and releases oxygen by heating.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride are preferable because they are thermally stable.

When an insulator from which oxygen is released by heating is provided as the insulator 550 in contact with the top surface of the oxide 530c, oxygen can be effectively supplied from the insulator 550 to the channel formation region of the oxide 530b through the oxide 530c. Furthermore, as in the insulator 524, the concentration of impurities such as water or hydrogen in the insulator 550 is preferably lowered. The thickness of the insulator 550 is preferably greater than or equal to 1 nm and less than or equal to 20 nm.

Furthermore, to efficiently supply excess oxygen contained in the insulator 550 to the oxide 530, a metal oxide may be provided between the insulator 550 and the conductor 560. The metal oxide preferably inhibits diffusion of oxygen from the insulator 550 to the conductor 560. Providing the metal oxide that inhibits diffusion of oxygen inhibits diffusion of excess oxygen from the insulator 550 to the conductor 560. That is, a reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Note that the insulator 550 may have a stacked-layer structure like the second gate insulating film. As miniaturization and high integration of transistors progress, a problem such as leakage current might arise because of a thinner gate insulating film. For that reason, when the insulating film functioning as the gate insulating film has a stacked-layer structure of a high-k material and a thermally stable material, a gate potential during transistor operation can be reduced while the physical thickness is maintained. Furthermore, the stacked-layer structure can be thermally stable and have a high dielectric constant.

Although the conductor 560 functioning as the first gate electrode has a two-layer structure in FIG. 6A and FIG. 6B, the conductor 560 may have a single-layer structure or a stacked-layer structure of three or more layers.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting diffusion of oxygen, it is possible to inhibit a reduction in conductivity of the conductor 560b due to oxidation caused by oxygen contained in the insulator 550. As a conductive material having a function of inhibiting diffusion of oxygen, for example, tantalum, tantalum nitride, ruthenium, ruthenium oxide, or the like is preferably used. For the conductor 560a, the oxide semiconductor that can be used as the oxide 530 can be used. In that case, when the conductor 560b is deposited by a sputtering method, the conductor 560a can have a reduced electrical resistance value to be a conductor. Such a conductor can be referred to as an OC (Oxide Conductor) electrode.

In addition, a conductive material containing tungsten, copper, or aluminum as its main component is preferably used for the conductor 560b. Furthermore, the conductor 560b also functions as a wiring and thus a conductor having high conductivity is preferably used as the conductor 560b. Moreover, the conductor 560b may have a stacked-layer structure, for example, a stacked-layer structure of the above conductive material and titanium or titanium nitride.

The insulator 580 is provided over the conductor 542a and the conductor 542b with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, resin, or the like. In particular, silicon oxide and silicon oxynitride are preferable because they are thermally stable. In particular, silicon oxide and porous silicon oxide are preferable because an excess-oxygen region can be easily formed in a later step.

When the insulator 580, which contains an excess oxygen region and releases oxygen by heating, is provided in contact with the oxide 530c, oxygen in the insulator 580 can be efficiently supplied to the oxide 530a and the oxide 530b through the oxide 530c. Note that the concentration of impurities such as water or hydrogen in the insulator 580 is preferably reduced.

The opening of the insulator 580 is formed to overlap with the region between the conductor 542a and the conductor 542b. Accordingly, the conductor 560 is formed to be embedded in the opening of the insulator 580 and the region between the conductor 542a and the conductor 542b.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; thus, even when the conductor 560 has a shape with a high aspect ratio, the conductor 560 can be formed without collapsing during the process.

The insulator 574 is preferably provided in contact with a top surface of the insulator 580, a top surface of the conductor 560, and a top surface of the insulator 550. When the insulator 574 is deposited by a sputtering method, excess-oxygen regions can be provided in the insulator 550 and the insulator 580. Accordingly, oxygen can be supplied from the excess-oxygen regions to the oxide 530.

For example, a metal oxide containing one kind or two or more kinds selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

In addition, an insulator 581 functioning as an interlayer film is preferably provided over the insulator 574. As in the insulator 524 or the like, the concentration of impurities such as water or hydrogen in the insulator 581 is preferably reduced.

Furthermore, a conductor 540a and a conductor 540b are positioned in openings formed in the insulator 581, the insulator 574, the insulator 580, and the insulator 544. The conductor 540a and the conductor 540b are provided to face each other with the conductor 560 therebetween. The structures of the conductor 540a and the conductor 540b are similar to a structure of a conductor 546 and a conductor 548 that will be described later.

An insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has an excellent blocking effect that prevents the passage of both oxygen and impurities such as hydrogen and moisture which are factors of a change in electrical characteristics of the transistor. Accordingly, aluminum oxide can prevent mixing of impurities such as hydrogen and moisture into the transistor 500 in a manufacturing process and after manufacturing of the transistor. In addition, release of oxygen from the oxide included in the transistor 500 can be inhibited. Therefore, aluminum oxide is suitably used for a protective film of the transistor 500.

In addition, an insulator 586 is provided over the insulator 582. For the insulator 586, a material similar to that for the insulator 320 can be used. Furthermore, when a material with a comparatively low permittivity is used for these insulators, parasitic capacitance generated between wirings can be reduced. A silicon oxide film, a silicon oxynitride film, or the like can be used for the insulator 586, for example.

Furthermore, the conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 300. The conductor 546 and the conductor 548 can be provided using materials similar to those for the conductor 328 and the conductor 330.

Note that after the transistor 500 is formed, an opening may be formed to surround the transistor 500 and an insulator having a high barrier property against hydrogen or water may be formed to cover the opening. Surrounding the transistor 500 by the insulator having a high barrier property can prevent entry of moisture and hydrogen from the outside. Alternatively, a plurality of transistors 500 may be collectively surrounded by the insulator having a high barrier property against hydrogen or water. In the case where an opening is formed to surround the transistor 500, for example, the formation of an opening reaching the insulator 514 or the insulator 522 and the formation of the insulator having a high barrier property in contact with the insulator 514 or the insulator 522 are suitable because these formation steps can also serve as some of the manufacturing steps of the transistor 500. Note that for example, a material similar to that for the insulator 522 may be used for the insulator having a high barrier property against hydrogen or water.

Next, the capacitor 600 is provided above the transistor 500. The capacitor 600 includes a conductor 610, a conductor 620, and an insulator 630.

In addition, a conductor 612 may be provided over the conductor 546 and the conductor 548. The conductor 612 has a function of a plug or a wiring that is connected to the transistor 500. The conductor 610 has a function of an electrode of the capacitor 600. Note that the conductor 612 and the conductor 610 can be formed at the same time.

For the conductor 612 and the conductor 610, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 612 and the conductor 610 each have a single-layer structure in FIG. 4; however, the structure is not limited thereto, and a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. Note that a conductive material such as a metal material, an alloy material, or a metal oxide material can be used for the conductor 620. It is preferable to use a high-melting-point material that has both heat resistance and conductivity, such as tungsten or molybdenum, and it is particularly preferable to use tungsten. In addition, in the case where the conductor 620 is formed concurrently with another component such as a conductor, Cu (copper), Al (aluminum), or the like, which is a low-resistance metal material, is used.

An insulator 640 is provided over the conductor 620 and the insulator 630. The insulator 640 can be provided using a material similar to that for the insulator 320. In addition, the insulator 640 may function as a planarization film that covers an uneven shape therebelow.

Figure 7A:
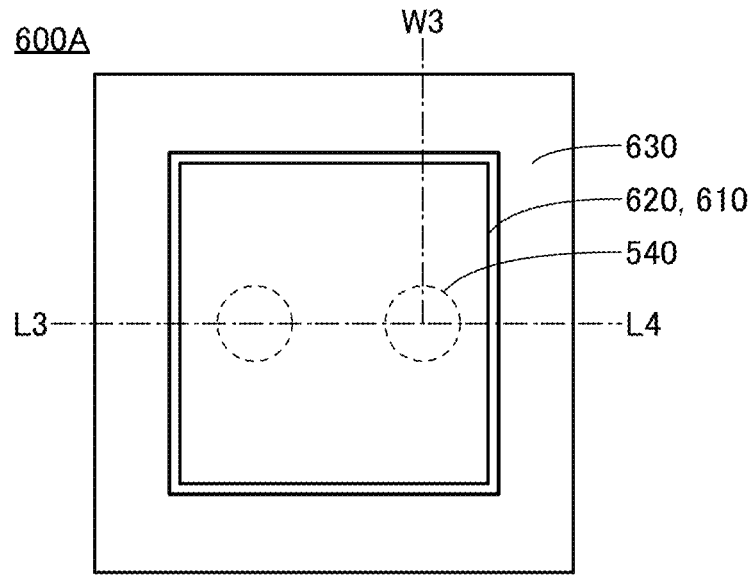
FIG. 7A is a top view illustrating a structure example of a capacitor.
Figure 7B:
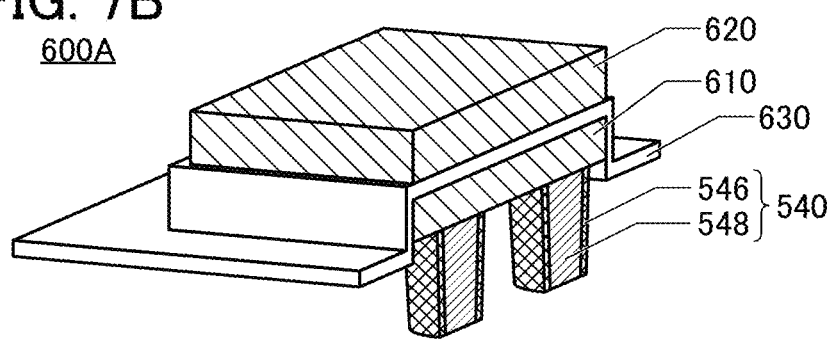
FIG. 7B is a cross-sectional perspective view illustrating the structure example of the capacitor.
Figure 7C:
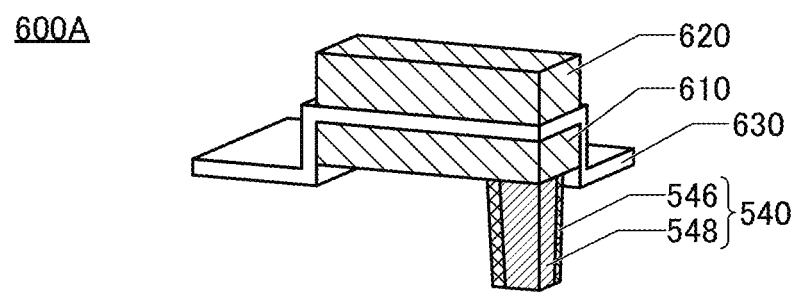
FIG. 7C is a cross-sectional perspective view illustrating the structure example of the capacitor.

Next, the capacitor 600 of the semiconductor device in FIG. 4 and FIG. 5 is described. FIG. 7 illustrates a capacitor 600A as an example of the capacitor 600 that can be used in the semiconductor device. FIG. 7A is a top view of the capacitor 600A, FIG. 7B is a perspective view illustrating a cross section of the capacitor 600A along the dashed-dotted line L3-L4, and FIG. 7C is a perspective view illustrating a cross section of the capacitor 600A along the dashed-dotted line W3-L4.

The conductor 610 functions as one of a pair of electrodes of the capacitor 600A, and the conductor 620 functions as the other of the pair of electrodes of the capacitor 600A. The insulator 630 functions as a dielectric between the pair of electrodes.

A bottom portion of the conductor 610 in the capacitor 600 is electrically connected to the conductor 546 and the conductor 548. The conductor 546 and the conductor 548 function as plugs or wirings for connecting to another circuit component. In FIG. 7, the conductor 546 and the conductor 548 are collectively denoted as a conductor 540.

For clarification of the drawing, the insulator 586 in which the conductor 546 and the conductor 548 are embedded and the insulator 640 that covers the conductor 620 and the insulator 630 are omitted in FIG. 7.

Although the capacitor 600 illustrated in FIG. 4, FIG. 5, and FIG. 7 is a planar capacitor, the shape of the capacitor is not limited thereto. For example, the capacitor 600 may be a cylindrical capacitor 600B illustrated in FIG. 8.

Figure 8A:
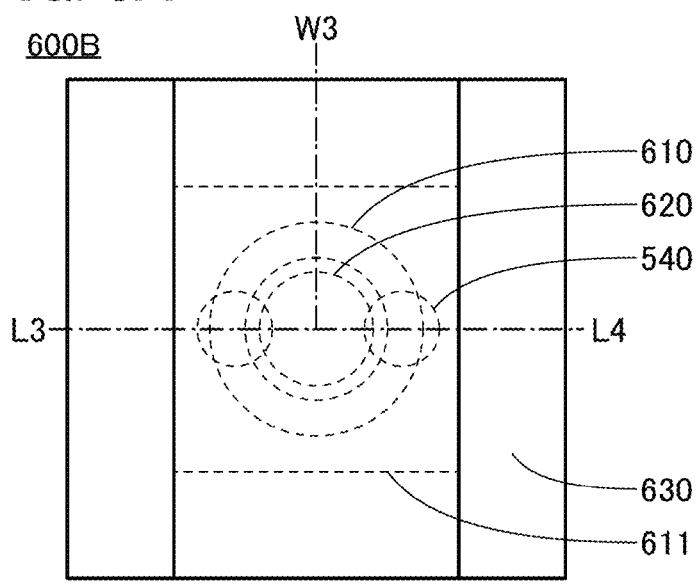
FIG. 8A is a top view illustrating a structure example of a capacitor.
Figure 8B:
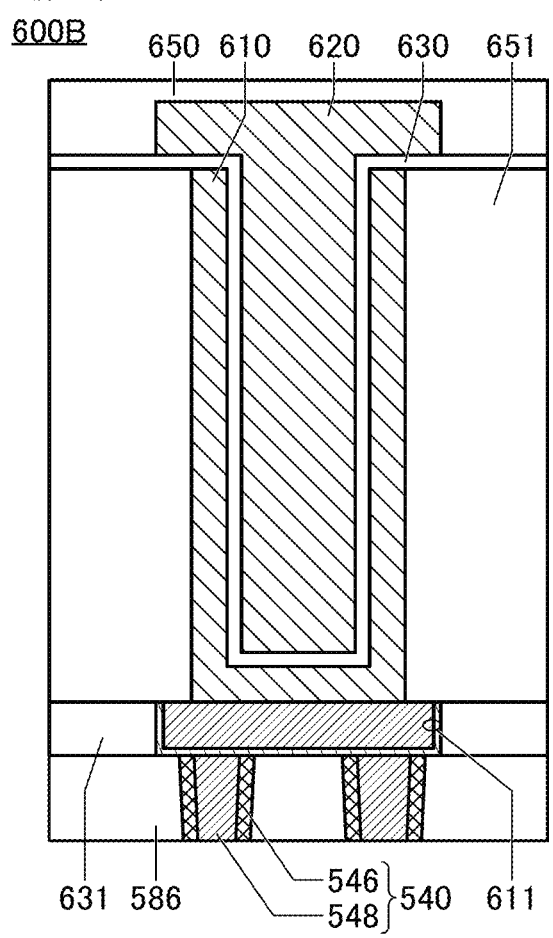
FIG. 8B is a cross-sectional view illustrating the structure example of the capacitor.
Figure 8C:
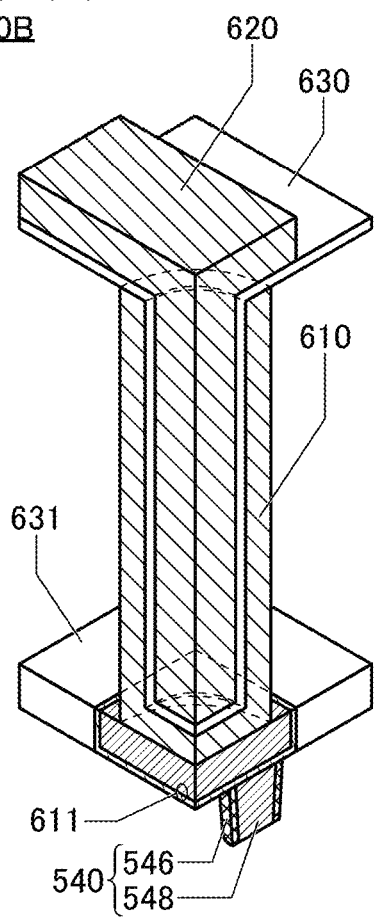
FIG. 8C is a cross-sectional perspective view illustrating the structure example of the capacitor.

FIG. 8A is a top view of the capacitor 600B, FIG. 8B is a perspective view illustrating a cross section of the capacitor 600B along the dashed-dotted line L3-L4, and FIG. 8C is a perspective view illustrating a cross section of the capacitor 600B along the dashed-dotted line W3-L4.

In FIG. 8B, the capacitor 600B includes an insulator 631 over the insulator 586 in which the conductor 540 is embedded, an insulator 651 having an opening, the conductor 610 functioning as one of a pair of electrodes, and the conductor 620 functioning as the other of the pair of electrodes.

For clarification of the drawing, the insulator 586, an insulator 650, and the insulator 651 are omitted in FIG. 8C.

The insulator 631 can be formed using a material similar to that for the insulator 586, for example.

A conductor 611 is embedded in the insulator 631 to be electrically connected to the conductor 540. The conductor 611 can be formed using a material similar to that for the conductor 330 and the conductor 518, for example.

The insulator 651 can be formed using a material similar to that for the insulator 586, for example.

The insulator 651 has an opening as described above, and the opening overlaps with the conductor 611.

The conductor 610 is formed on the bottom portion and the side surface of the opening. In other words, the conductor 610 overlaps the conductor 611 and is electrically connected to the conductor 611.

Note that the conductor 610 is formed in such a manner that the opening is formed in the insulator 651 by an etching method or the like, and then, the conductor 610 is deposited by a sputtering method, an ALD method, or the like. After that, the conductor 610 formed over the insulator 651 is removed by a CMP (Chemical Mechanical Polishing) method or the like while the conductor 610 in the opening is left.

The insulator 630 is positioned over the insulator 651 and over the formation surface of the conductor 610. Note that the insulator 630 functions as a dielectric between the pair of electrodes in the capacitor.

The conductor 620 is formed over the insulator 630 so as to fill the opening of the insulator 651.

The insulator 650 is formed to cover the insulator 630 and the conductor 620.

The electrostatic capacitance of the cylindrical capacitor 600B illustrated in FIG. 8 can be higher than that of the planar capacitor 600A. Therefore, the use of the capacitor 600B enables the voltage between terminals of the capacitor to be kept for a long time.

With the use of the structure, a semiconductor device using a transistor including an oxide semiconductor can be miniaturized or highly integrated.

Note that this embodiment can be combined with other embodiments in this specification as appropriate.

Embodiment 4

In this embodiment, the compositions of a CAC-OS (Cloud-Aligned Composite Oxide Semiconductor) and a CAAC-OS (c-axis Aligned Crystalline Oxide Semiconductor), which are metal oxides that can be used in the OS transistor described in the above embodiments, will be described.

<Composition of Metal Oxide>

A CAC-OS or a CAC-metal oxide has a conducting function in part of the material and has an insulating function in another part of the material; as a whole, the CAC-OS or the CAC-metal oxide has a function of a semiconductor. In the case where the CAC-OS or the CAC-metal oxide is used in an active layer of a transistor, the conducting function is a function of allowing electrons (or holes) serving as carriers to flow, and the insulating function is a function of not allowing electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

The CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, in some cases, the conductive regions are observed to be coupled in a cloud-like manner with their boundaries blurred.

In the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm and are dispersed in the material in some cases.

The CAC-OS or the CAC-metal oxide includes components having different band gaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel region of a transistor, high current driving capability in the on state of the transistor, that is, a high on-state current and high field-effect mobility can be obtained.

In other words, the CAC-OS or the CAC-metal oxide can also be referred to as a matrix composite or a metal matrix composite.

<Structure of Metal Oxide>

Oxide semiconductors can be classified into a single crystal oxide semiconductor and a non-single-crystal oxide semiconductor. Examples of a non-single-crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

Oxide semiconductors might be classified in a manner different from the above-described one when classified in terms of the crystal structure. The classification of the crystal structures of oxide semiconductor will be explained with FIG. 9A. FIG. 9A is a diagram showing the classification of crystal structures of an oxide semiconductor, typically IGZO (a metal oxide containing In, Ga, and Zn).

As shown in FIG. 9A, IGZO is roughly classified into Amorphous, Crystalline, and Crystal. Amorphous includes completely amorphous structure. Crystalline includes CAAC (c-axis-aligned crystalline), nc (nanocrystalline), and CAC (Cloud-Aligned Composite). Crystal includes single crystal and poly crystal.

Note that the structure shown in the thick frame in FIG. 9A is a structure that belongs to new crystalline phase. This structure is positioned in a boundary region between Amorphous and Crystal. In other words, Amorphous, which is energetically unstable, and Crystalline are completely different structures.

A crystal structure of a film or a substrate can be analyzed with X-ray diffraction (XRD) images. Here, XRD spectra of quartz glass and IGZO, which has a crystal structure classified into crystalline (also referred to as crystalline IGZO), are shown in FIG. 9B and FIG. 9C. FIG. 9B shows an XRD spectrum of quartz glass and FIG. 9C shows an XRD spectrum of crystalline IGZO. Note that the crystalline IGZO shown in FIG. 9C has a composition of In:Ga:Zn=4:2:3 [atomic ratio]. Furthermore, the crystalline IGZO shown in FIG. 9C has a thickness of 500 nm.

As indicated by arrows in FIG. 9B, the XRD spectrum of the quartz glass shows a substantially symmetrical peak. In contrast, as indicated by arrows in FIG. 9C, the XRD spectrum of the crystalline IGZO shows an asymmetrical peak. The asymmetrical peak of the XRD spectrum clearly shows the existence of crystal. In other words, the structure cannot be regarded as Amorphous unless it has a bilaterally symmetrical peak in the XRD spectrum.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) cannot be observed even in the vicinity of distortion in the CAAC-OS. That is, formation of a crystal grain boundary is inhibited due to the distortion of lattice arrangement. This is probably because the CAAC-OS can tolerate distortion owing to the low density of arrangement of oxygen atoms in the a-b plane direction, a change in interatomic bond distance by substitution of a metal element, and the like.

Furthermore, the CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is an oxide semiconductor with high crystallinity. By contrast, in the CAAC-OS, it can be said that a reduction in electron mobility due to the crystal grain boundary is less likely to occur because a clear crystal grain boundary cannot be observed. Moreover, since the crystallinity of an oxide semiconductor might be decreased by entry of impurities, formation of defects, or the like, the CAAC-OS can be regarded as an oxide semiconductor that has small amounts of impurities and defects (oxygen vacancies or the like). Thus, an oxide semiconductor including a CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend a degree of freedom of the manufacturing process.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

The a-like OS is an oxide semiconductor having a structure between those of the nc-OS and the amorphous oxide semiconductor. The a-like OS includes a void or a low-density region. That is, the a-like OS has low crystallinity as compared with the nc-OS and the CAAC-OS.

An oxide semiconductor has various structures with different properties. Two or more of the amorphous oxide semiconductor, the polycrystalline oxide semiconductor, the a-like OS, the nc-OS, and the CAAC-OS may be included in an oxide semiconductor of one embodiment of the present invention.

<Transistor Including Oxide Semiconductor>

Next, the case where the above oxide semiconductor is used for a transistor will be described.

When the above oxide semiconductor is used for a transistor, a transistor with high field-effect mobility can be achieved. In addition, a transistor having high reliability can be achieved.

An oxide semiconductor with a low carrier concentration is preferably used for a transistor. In the case where the carrier concentration of an oxide semiconductor film is lowered, the impurity concentration in the oxide semiconductor film is lowered to decrease the density of defect states. In this specification and the like, a state with a low impurity concentration and a low density of defect states is referred to as a highly purified intrinsic or substantially highly purified intrinsic state.

A highly purified intrinsic or substantially highly purified intrinsic oxide semiconductor film has a low density of defect states and thus has a low density of trap states in some cases.

Charges trapped by the trap states in the oxide semiconductor take a long time to be released and may behave like fixed charges. Thus, a transistor whose channel formation region is formed in an oxide semiconductor having a high density of trap states has unstable electrical characteristics in some cases.

Accordingly, in order to obtain stable electrical characteristics of the transistor, it is effective to reduce the concentration of impurities in the oxide semiconductor. In addition, in order to reduce the concentration of impurities in the oxide semiconductor, the impurity concentration in an adjacent film is also preferably reduced. Examples of impurities include hydrogen, nitrogen, an alkali metal, an alkaline earth metal, iron, nickel, and silicon.

<Impurity>

Here, the influence of each impurity in the oxide semiconductor will be described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Accordingly, it is preferable to reduce the concentration of an alkali metal or an alkaline earth metal in the oxide semiconductor. Specifically, the concentration of an alkali metal or an alkaline earth metal in the oxide semiconductor that is obtained by SIMS is set lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. Hence, nitrogen in the oxide semiconductor is preferably reduced as much as possible; the nitrogen concentration in the oxide semiconductor that is obtained by SIMS is set, for example, lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Furthermore, hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor obtained by SIMS is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for a channel formation region of a transistor, stable electrical characteristics can be given.

Note that this embodiment can be combined with other embodiments in this specification as appropriate.

Embodiment 5

In this embodiment, examples of a semiconductor wafer where the semiconductor device or the like described in the above embodiment is formed and electronic components incorporating the semiconductor device will be described.

<Semiconductor Wafer>

First, an example of a semiconductor wafer where a semiconductor device or the like is formed is described with reference to FIG. 10A.

Figure 10A:
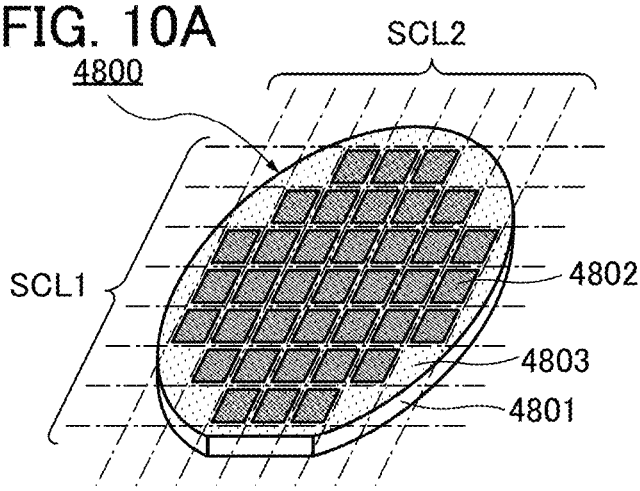
FIG. 10A is a perspective view illustrating an example of a semiconductor wafer.

A semiconductor wafer 4800 illustrated in FIG. 10A includes a wafer 4801 and a plurality of circuit portions 4802 provided on the top surface of the wafer 4801. A portion without the circuit portion 4802 on the top surface of the wafer 4801 is a spacing 4803 that is a region for dicing.

The semiconductor wafer 4800 can be fabricated by forming the plurality of circuit portions 4802 on the surface of the wafer 4801 by a pre-process. After that, a surface of the wafer 4801 opposite to the surface provided with the plurality of circuit portions 4802 may be ground to thin the wafer 4801. Through this step, warpage or the like of the wafer 4801 is reduced and the size of the component can be reduced.

A dicing step is performed as the next step. The dicing is performed along scribe lines SCL1 and scribe lines SCL2 (referred to as a dicing line or cutting lines in some cases) indicated by dashed-dotted lines. Note that to perform the dicing step easily, it is preferable that the spacing 4803 be provided so that the plurality of scribe lines SCL1 are parallel to each other, the plurality of scribe lines SCL2 are parallel to each other, and the scribe lines SCL1 are perpendicular to the scribe line SCL2.

Figure 10B:
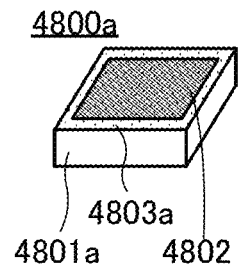
FIG. 10B is a perspective view of an example of a semiconductor wafer that has been divided.

With the dicing step, a chip 4800a as illustrated in FIG. 10B can be cut out from the semiconductor wafer 4800. The chip 4800a includes a wafer 4801a, the circuit portion 4802, and a spacing 4803a. Note that it is preferable to make the spacing 4803a small as much as possible. In this case, the width of the spacing 4803 between adjacent circuit portions 4802 is substantially the same as a cutting allowance of the scribe line SCL1 or a cutting allowance of the scribe line SCL2.

Note that the shape of the element substrate of one embodiment of the present invention is not limited to the shape of the semiconductor wafer 4800 illustrated in FIG. 10A. The element substrate may be a rectangular semiconductor wafer, for example. The shape of the element substrate can be changed as appropriate, depending on a manufacturing process of an element and an apparatus for manufacturing the element.

<Electronic Components>

Next, examples of electronic components incorporating the chip 4800a are described with reference to FIG. 10C and FIG. 10D.

Figure 10C:
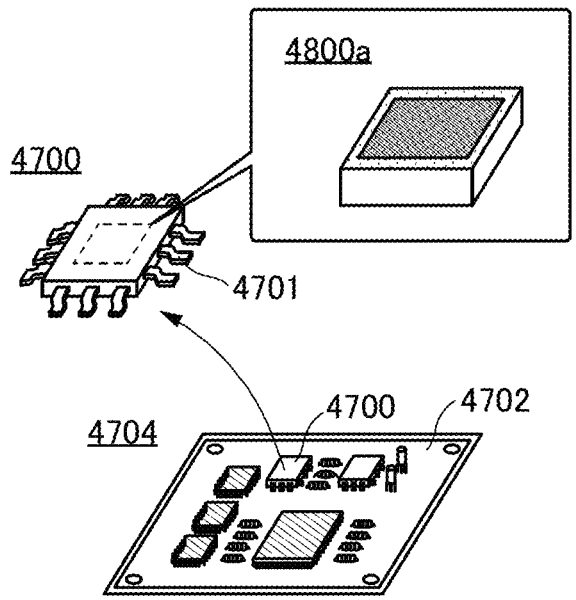
FIG. 10C and FIG. 10D are perspective views illustrating examples of electronic components.

FIG. 10C is a perspective view of an electronic component 4700 and a substrate (a mounting board 4704) on which the electronic component 4700 is mounted. The electronic component 4700 illustrated in FIG. 10C includes a lead 4701 and the above-described chip 4800a, and functions as an IC chip or the like.

The electronic component 4700 can be formed by, for example, a wire bonding step of electrically connecting the lead 4701 of a lead frame to an electrode on the chip 4800a with a metal fine line (wire), a molding step of performing sealing with an epoxy resin or the like, a plating step on the lead 4701 of the lead frame, and a printing step on a surface of the package. Ball bonding or wedge bonding, for example, can be used in the wire bonding step. Although a QFP (Quad Flat Package) is used as the package of the electronic component 4700 in FIG. 10C, the mode of the package is not limited thereto.

The electronic component 4700 is mounted on a printed circuit board 4702, for example. A plurality of such IC chips are combined and electrically connected to each other on the printed circuit board 4702, whereby the mounting board 4704 is completed.

Figure 10D:
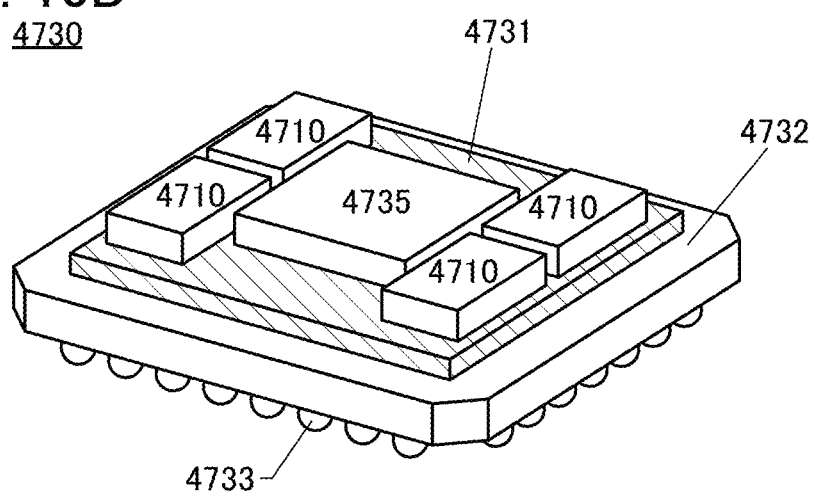

FIG. 10D is a perspective view of an electronic component 4730. The electronic component 4730 is an example of a SiP (System in Package) or an MCM (Multi Chip Module). In the electronic component 4730, an interposer 4731 is provided on a package substrate 4732 (a printed circuit board), and a semiconductor device 4735 and a plurality of semiconductor devices 4710 are provided on the interposer 4731.

The electronic component 4730 includes the semiconductor devices 4710. Examples of the semiconductor devices 4710 include the semiconductor device described in the above embodiment and a high bandwidth memory (HBM). An integrated circuit (a semiconductor device) such as a CPU, a GPU, an FPGA, or a memory device can be used as the semiconductor device 4735.

As the package substrate 4732, a ceramic substrate, a plastic substrate, a glass epoxy substrate, or the like can be used. As the interposer 4731, a silicon interposer, a resin interposer, or the like can be used.

The interposer 4731 includes a plurality of wirings and has a function of electrically connecting a plurality of integrated circuits with different terminal pitches. The plurality of wirings are provided in a single layer or multiple layers. Moreover, the interposer 4731 has a function of electrically connecting an integrated circuit provided on the interposer 4731 to an electrode provided on the package substrate 4732. Accordingly, the interposer is referred to as a "redistribution substrate" or an "intermediate substrate" in some cases. A through electrode may be provided in the interposer 4731 and used to electrically connect an integrated circuit and the package substrate 4732. For a silicon interposer, a TSV (Through Silicon Via) can also be used as the through electrode.

A silicon interposer is preferably used as the interposer 4731. A silicon interposer can be manufactured at lower cost than an integrated circuit because it is not necessary to provide an active element. Meanwhile, since wirings of a silicon interposer can be formed through a semiconductor process, formation of minute wirings, which is difficult for a resin interposer, is easy.

In order to achieve a wide memory bandwidth, many wirings need to be connected to HBM. Therefore, formation of minute and high-density wirings is required for an interposer on which HBM is mounted. For this reason, a silicon interposer is preferably used as the interposer on which HBM is mounted.

In a SiP, an MCM, or the like using a silicon interposer, the decrease in reliability due to a difference in expansion coefficient between an integrated circuit and the interposer is less likely to occur. Furthermore, the surface of a silicon interposer has high planarity, so that a poor connection between the silicon interposer and an integrated circuit provided on the silicon interposer is less likely to occur. It is particularly preferable to use a silicon interposer for a 2.5D package (2.5-dimensional mounting) in which a plurality of integrated circuits are arranged side by side on an interposer.

A heat sink (a radiator plate) may be provided to overlap with the electronic component 4730. In the case of providing a heat sink, the heights of integrated circuits provided on the interposer 4731 are preferably equal to each other. For example, in the electronic component 4730 described in this embodiment, the heights of the semiconductor devices 4710 and the semiconductor device 4735 are preferably equal to each other.

To mount the electronic component 4730 on another substrate, an electrode 4733 may be provided on the bottom portion of the package substrate 4732. FIG. 10D illustrates an example in which the electrode 4733 is formed of a solder ball. Solder balls are provided in a matrix on the bottom portion of the package substrate 4732, whereby BGA (Ball Grid Array) mounting can be achieved. Alternatively, the electrode 4733 may be formed of a conductive pin. When conductive pins are provided in a matrix on the bottom portion of the package substrate 4732, PGA (Pin Grid Array) mounting can be achieved.

The electronic component 4730 can be mounted on another substrate by various mounting methods not limited to BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

Note that this embodiment can be combined with other embodiments in this specification as appropriate.

Embodiment 6

In this embodiment, an electronic device to which the semiconductor device described in the above embodiment is applied will be described.

Figure 11:
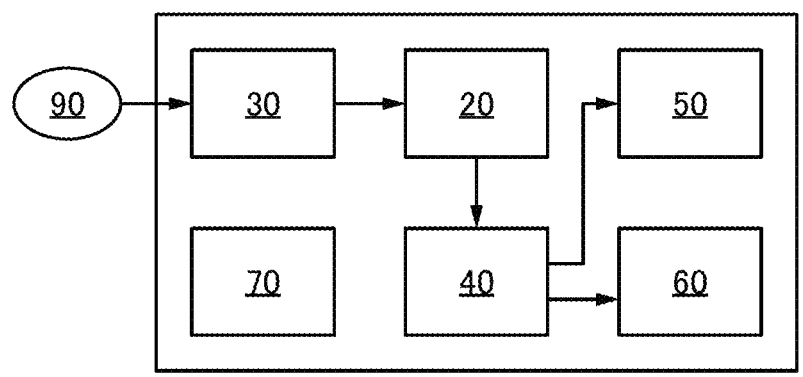
FIG. 11 is a block diagram illustrating a structural example of an electronic device.

FIG. 11 illustrates a structure example of the semiconductor device described in the above embodiment. An electronic device 100 includes the circuit 20 that is the semiconductor device, a detection unit 30, a processing unit 40, a memory unit 50, a display unit 60, and a power supply circuit 70.

The electronic device 100 has a function of a sensor that obtains a detection object 90 from the outside and converts the detection object 90 into information such as an electrical signal. Examples of the detection object 90 include temperature, light (including visible light, X-rays, ultraviolet rays, infrared rays, and the like), sound, material (component) such as water and gas, force, displacement, position, speed, acceleration, angular velocity, rotational frequency, magnetism, electric field, current, voltage, electric power, radiation, flow rate, and gradient.

The detection unit 30 has a function of detecting one or more selected from the above-described detection objects 90 and a function of outputting current at the time of detecting the detection object(s) 90. Note that the amount of current output by the detection unit 30 is preferably changed in accordance with the amount, intensity, magnitude, or the like of the detection object. The output current is input to the input terminal of the circuit 20.

As described in the above embodiment, the circuit 20 outputs a voltage corresponding to the current input to the input terminal, to the output terminal. The voltage is supplied to the processing unit 40.

The power supply circuit 70 has a function of supplying power to devices included in the electronic device 100, such as the circuit 20 and the detection unit 30.

The processing unit 40 has a function of calculating the physical quantity of the detection object 90 on the basis of the voltage output from the circuit 20. The calculated physical quantity is transmitted to the memory unit 50 and/or the display unit 60.

The memory unit 50 has a function of storing the physical quantity transmitted from the processing unit 40. Depending on the usage of the electronic device 100, the memory unit 50 is not necessarily included in the electronic device 100.

The display unit 60 has a function of visually displaying the physical quantity transmitted from the processing unit 40. As the display unit 60, a display device (a liquid crystal display device, a light-emitting device, or the like) or a meter (measurer) can be used, for example.

Next, an example of a product that can be used as the electronic device 100 will be described.

[Video Camera]

The electronic device 100 described above can be applied to a video camera.

Figure 12A:
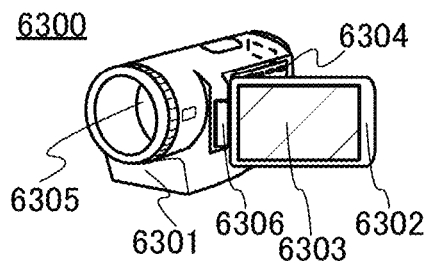
FIG. 12A, FIG. 12B, FIG. 12C, FIG. 12D, and FIG. 12E are perspective views illustrating examples of products.

FIG. 12A illustrates a video camera 6300 as an example of an imaging device. The video camera 6300 includes a first housing 6301, a second housing 6302, a display unit 6303, an operation key 6304, a lens 6305, a joint 6306, and the like. The operation key 6304 and the lens 6305 are provided in the first housing 6301, and the display unit 6303 is provided in the second housing 6302. The first housing 6301 and the second housing 6302 are connected to each other with the joint 6306, and the angle between the first housing 6301 and the second housing 6302 can be changed with the joint 6306. A video displayed on the display unit 6303 may be switched in accordance with the angle at the joint 6306 between the first housing 6301 and the second housing 6302.

The video camera 6300 takes a video for detection of the detection object 90. Thus, the detection unit 30 corresponds to a cell (image sensor) including a photoelectric conversion element (imaging element) in the video camera 6300, and the display unit 60 corresponds to the display unit 6303.

[Camera]

The electronic device 100 described above can be applied to a camera.

Figure 12B:
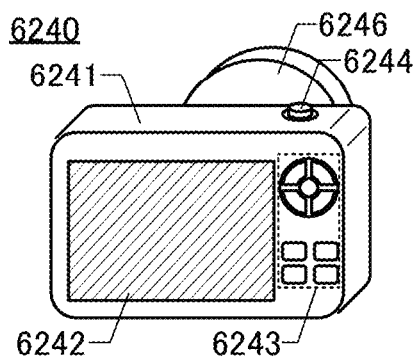

FIG. 12B illustrates a digital camera 6240 as an example of an imaging device. The digital camera 6240 includes a housing 6241, a display unit 6242, operation buttons 6243, a shutter button 6244, and the like, and a detachable lens 6246 is attached to the digital camera 6240. Here, the lens 6246 of the digital camera 6240 is detachable from the housing 6241 for replacement; alternatively, the lens 6246 may be incorporated into the housing 6241. A stroboscope, a viewfinder, or the like may be additionally provided in the digital camera 6240.

The digital camera 6240 takes an image of a subject for detection of the detection object 90. Thus, the detection unit 30 corresponds to a cell (image sensor) including a photoelectric conversion element (imaging element) in the digital camera 6240, and the display unit 60 corresponds to the display unit 6242.

The detection object 90 is not limited to a subject, and the brightness of external light may be the detection object 90. Thus, the digital camera 6240 can have a function of automatically lighting a flash bulb in accordance with the brightness of the environmental, a function of toning the taken image, and the like.

[Robot]

The electronic device 100 described above can be applied to a robot.

Figure 12C:
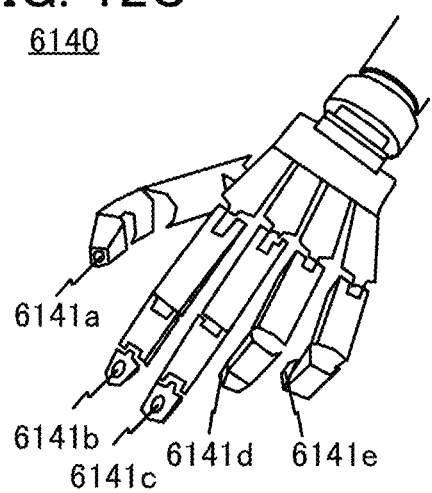

FIG. 12C illustrates an example of a robot. A robot 6140 includes contact sensors 6141a to 6141e. The robot 6140 can grasp an object with the use of the contact sensors 6141a to 6141e. For example, the contact sensors 6141a to 6141e have a function such that current flows through the object in accordance with a contact area at the time of touching the object, and the robot 6140 can recognize that the robot 6140 grasps the object, from the amount of the flowing current.

Figure 12D:
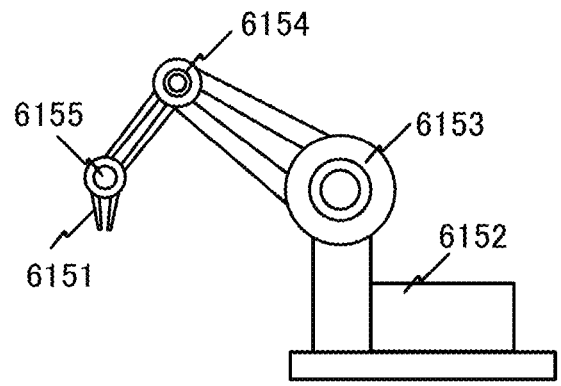

FIG. 12D illustrates an example of an industrial robot. The industrial robot preferably includes a plurality of drive shafts to control the driving range minutely. An example in which an industrial robot 6150 includes a function unit 6151, a control unit 6152, a drive shaft 6153, a drive shaft 6154, and a drive shaft 6155 is illustrated. The function unit 6151 preferably includes a sensor such as an image detection module.

The function unit 6151 preferably has one or more functions of grasping, cutting, welding, applying, and bonding an object, for example. The productivity of the industrial robot 6150 is increased as the response is improved. In order that the industrial robot 6150 can operate precisely, a sensor that detects a minute current or the like is preferably provided.

[Alarm]

Figure 12E:
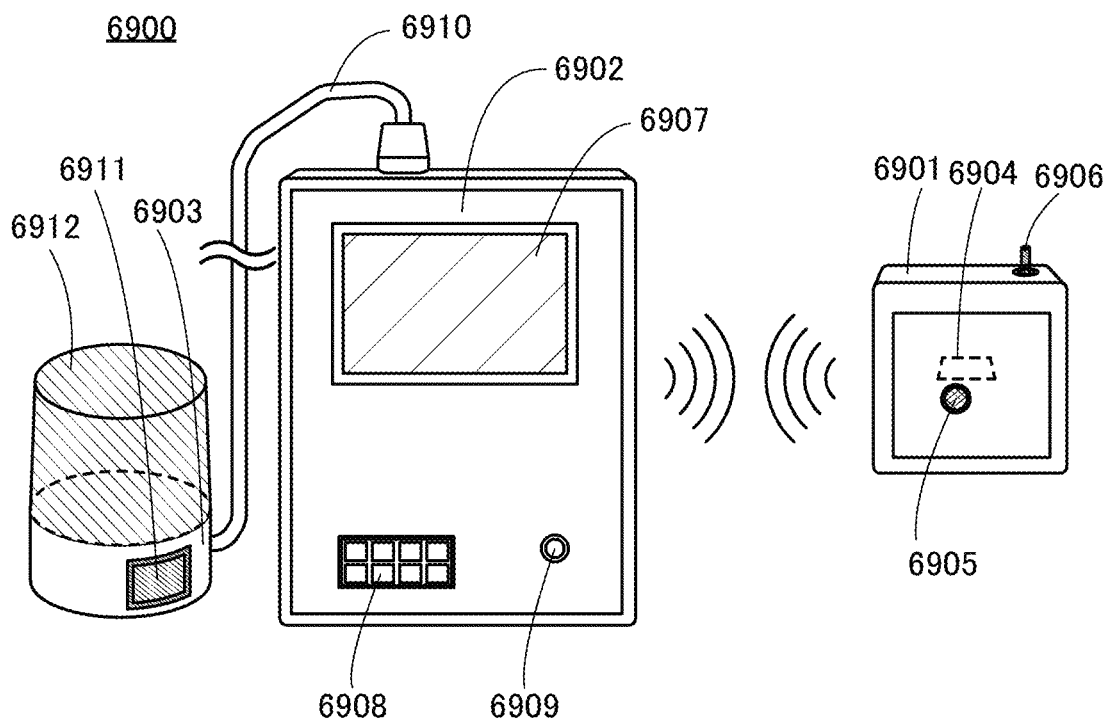

The electronic device 100 described above can be applied to an alarm. FIG. 12E illustrates an alarm 6900, which includes a sensor 6901, a receiver 6902, and a transmitter 6903.

The sensor 6901 includes a sensor circuit 6904, a window 6905, an operation key 6906, and the like. The sensor circuit 6904 is irradiated with light that has passed through the window 6905. The sensor circuit 6904 can be, for example, a detector in which water leakage, electric leakage, gas leakage, fire, the water level of a river that may overflow, the seismic intensity of an earthquake, a radiation, or the like is the detection object 90. For example, when the sensor circuit 6904 senses the detection object 90 with a predetermined value or more, the sensor 6901 sends information thereof to the receiver 6902. The receiver 6902 includes a display unit 6907, operation keys 6908, an operation key 6909, a wiring 6910, and the like. The receiver 6902 controls the operation of the transmitter 6903 in accordance with the information from the sensor 6901. The transmitter 6903 includes a speaker 6911, a lighting device 6912, and the like. The transmitter 6903 has a function of giving an alarm in accordance with a command from the receiver 6902. Although FIG. 12E illustrates an example in which the transmitter 6903 gives a sound alarm using the speaker 6911 and gives an optical alarm using the lighting device 6912 such as red light, the transmitter 6903 may give any one of the alarms or another alarm.

In the case where the sensor circuit functions as a fire alarm, the receiver 6902 may command fire preventive equipment such as a shutter to perform a predetermined operation when an alarm is given. Although FIG. 12E illustrates an example in which signals are wirelessly transmitted and received between the receiver 6902 and the sensor 6901, signals may be transmitted and received via a wiring or the like. In addition, although FIG. 12E illustrates an example in which a signal is transmitted from the receiver 6902 to the transmitter 6903 via the wiring 6910, a signal may be wirelessly transmitted.

[ICD]

The electronic device 100 described above can be applied to an implantable cardioverter-defibrillator (ICD).

Figure 13A:
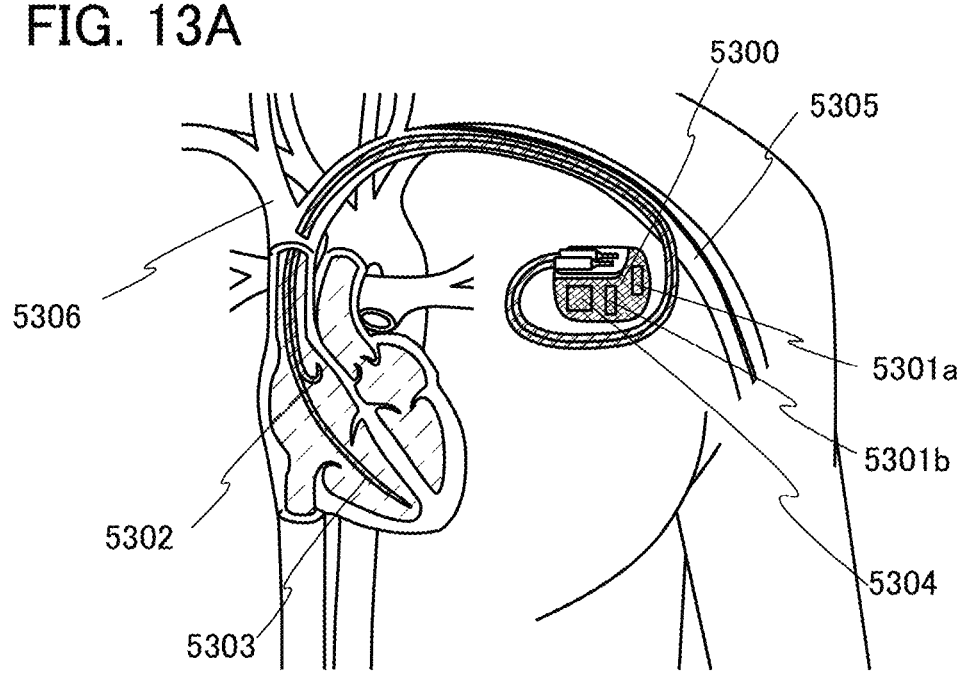
FIG. 13A and FIG. 13B are perspective views illustrating examples of products.

FIG. 13A is a schematic cross-sectional view illustrating an example of an ICD. An ICD body 5300 includes at least batteries 5301a and 5301b, a regulator, a control circuit, an antenna 5304, a wire 5302 reaching a right atrium, and a wire 5303 reaching a right ventricle.

The ICD body 5300 is implanted in the body by surgery, and the two wires pass through a subclavian vein 5305 and a superior vena cava 5306 of the human body, with the end of one of the wires placed in the right ventricle and the end of the other wire placed in the right atrium.

The ICD body 5300 functions as a pacemaker and paces the heart when the heart rate is not within a predetermined range. When the heart rate is not recovered by pacing (e.g., when ventricular tachycardia or ventricular fibrillation occurs), treatment with an electrical shock is performed.

The ICD body 5300 needs to monitor the heart rate all the time in order to perform pacing and deliver electrical shocks as appropriate. For that reason, the ICD body 5300 includes a sensor for measuring the heart rate. The electronic device 100 in FIG. 11 can be used as the sensor. In this case, the detection object 90 is the heart rate. Since the ICD body 5300 is implanted in the body, the ICD body 5300 does not necessarily include the display unit 60. Data of the heart rate, the number of times of treatment with pacing, the duration of the treatment with pacing, and the like can be stored in the memory unit 50 in the ICD body 5300.

The antenna 5304 can receive electric power, and the plurality of batteries 5301a and 5301b are charged with the electric power, which can reduce the frequency of replacing the pacemaker. The ICD body 5300, which includes the plurality of batteries, provides a high level of safety, and the plurality of batteries also function as auxiliary power supplies because even when one of them fails, the other can function.

Other than the antenna 5304 capable of receiving electric power, an antenna that can transmit physiological signals may be included. For example, a system that monitors the cardiac activity so as to check physiological signals such as a pulse, a respiratory rate, a heart rate, and body temperature with an external monitoring device may be constructed.

Figure 13B:
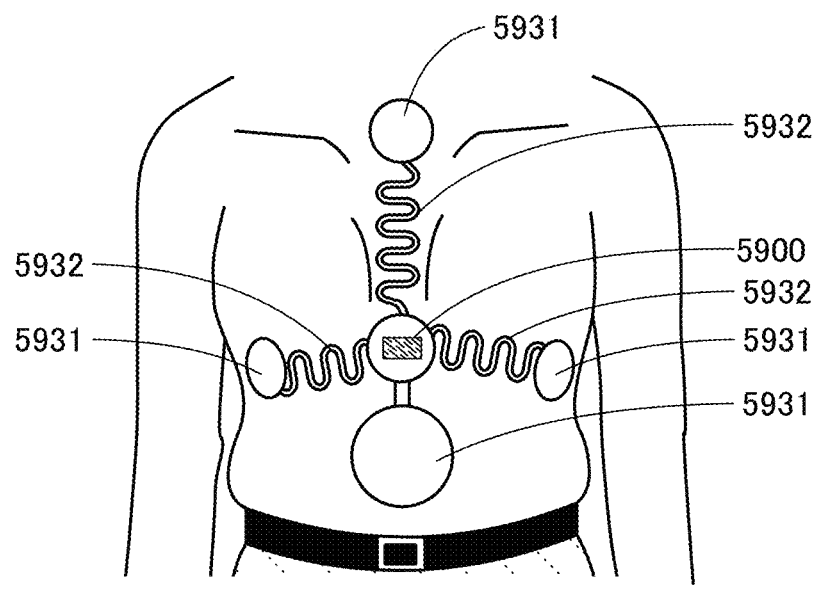

A sensor 5900 illustrated in FIG. 13B is attached to a human body with the use of a bond pad or the like. The sensor 5900 obtains biological information or the like such as a heart rate or an electrocardiogram by supplying a signal through a wiring 5932 to an electrode 5931 or the like attached to the human body. The obtained data is transmitted to a terminal such as a reading device as a wireless signal.

Note that this embodiment can be combined with other embodiments in this specification as appropriate.

Example 1

<Calculation and the Result>

To verify whether measurement of a minute current was appropriately performed in the structure of the circuit 20 illustrated in FIG. 1A, calculation was performed using a circuit simulator.

Software used in the calculation is a circuit simulator SmartSpice (version 8.2.12.R) produced by Silvaco, Inc. With the simulator, calculation was performed on the output voltage $V_{out}$ output from the output terminal OT, with respect to a current input to the first terminal of the transistor M1.

Figure 14A:
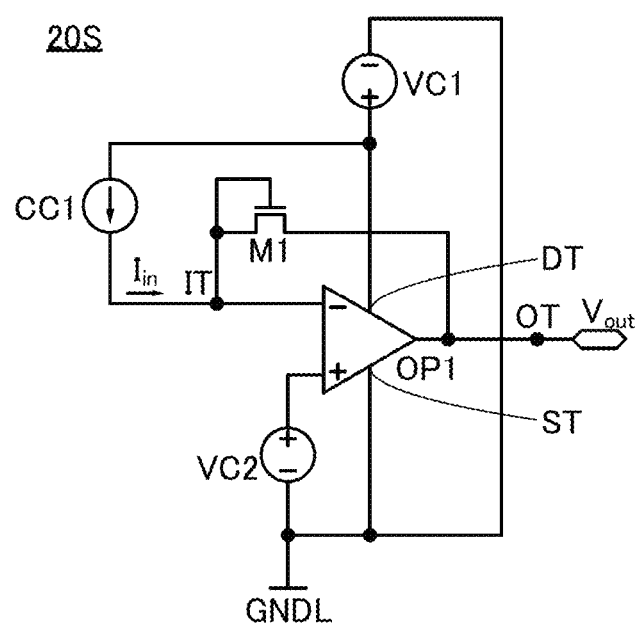
FIG. 14A and FIG. 14B are diagrams showing conditions for circuit calculation.

First, a circuit structure for the calculation will be described. FIG. 14A is a circuit structure that was input to the circuit simulator on the basis of the circuit 20 illustrated in FIG. 1A. A circuit 20S includes constant voltage sources VC1 and VC2 and a constant current source CC1 in addition to the circuit 20 in FIG. 1A.

A positive-side terminal of the constant voltage source VC1 is electrically connected to a high power supply potential input terminal DT of the operational amplifier OP1 and a negative-side terminal of the constant current source CC1, and a positive-side terminal of the constant current source CC1 is electrically connected to the first terminal and the gate of the transistor M1 and the inverting input terminal of the operational amplifier OP1. A positive-side terminal of the constant voltage source VC2 is electrically connected to the non-inverting input terminal of the operational amplifier OP1. The wiring GNDL is electrically connected to a negative-side terminal of the constant voltage source VC1, a negative-side terminal of the constant voltage source VC2, and a low power supply potential input terminal ST of the operational amplifier OP1. Note that in the calculation, the potential of the wiring GNDL is 0 V.

The conditions are set so that a voltage of 3.3 V is applied between the positive-side terminal and the negative-side terminal of the constant voltage source VC1 and a voltage of 1.5 V is applied between the positive-side terminal and the negative-side terminal of the constant voltage source VC2. The constant current source CC1 functions as a circuit that generates a current $I_{in}$ to be input to the input terminal IT of the circuit 20S, and a current of 1 zA to 1 mA is input to the input terminal IT in this calculation.

In the calculation conditions, the channel length of the transistor M1 was 0.36 μm, the channel width thereof was 0.36 μm, and the threshold voltage thereof was 0.83 V.

Figure 14B:
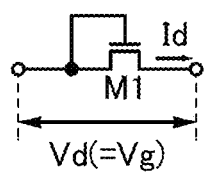
Figure 15:
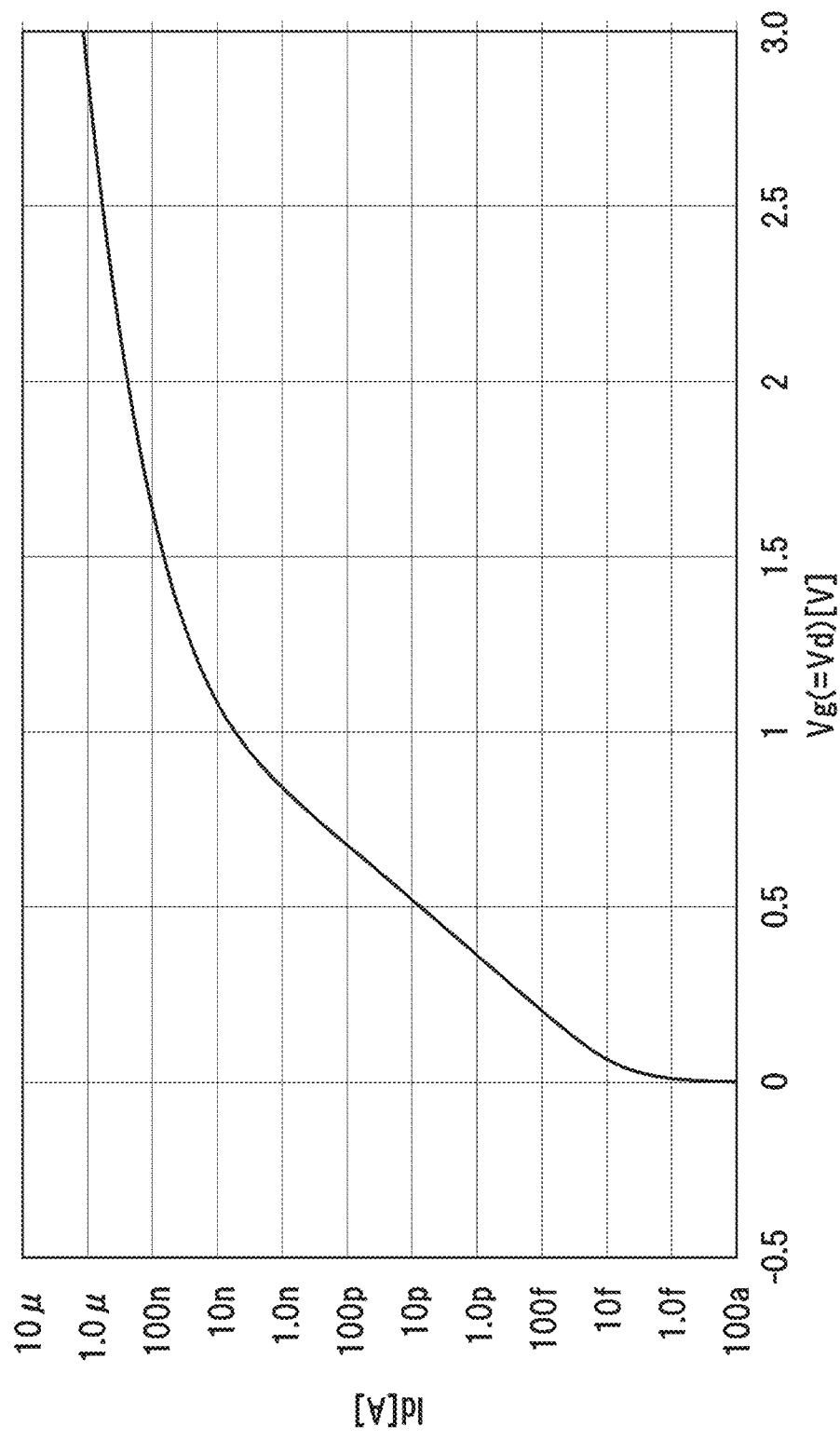
FIG. 15 is a diagram showing voltage-current characteristics of a diode-connected transistor.

For the calculation of the characteristics of the voltage $V_{out}$ and the current $I_{in}$ of the circuit 20S, the diode characteristics of the diode-connected transistor M1 are described first. FIG. 14B illustrates only the diode-connected transistor M1 of FIG. 14A. When a voltage applied to the gate is set to Vg (a voltage applied between the first terminal and the second terminal of the transistor M1 is set to Vd), a current Id flowing between the first terminal and the second terminal of the transistor M1, which is obtained by calculation with a similar circuit simulator, is as shown in the results of FIG. 15.

Next, calculation was performed on the output voltage $V_{out}$ output from the output terminal OT, with respect to the current $I_{in}$ input to the first terminal of the transistor M1 in the circuit 20S. The calculation results are shown in FIG. 16.

Figure 16:
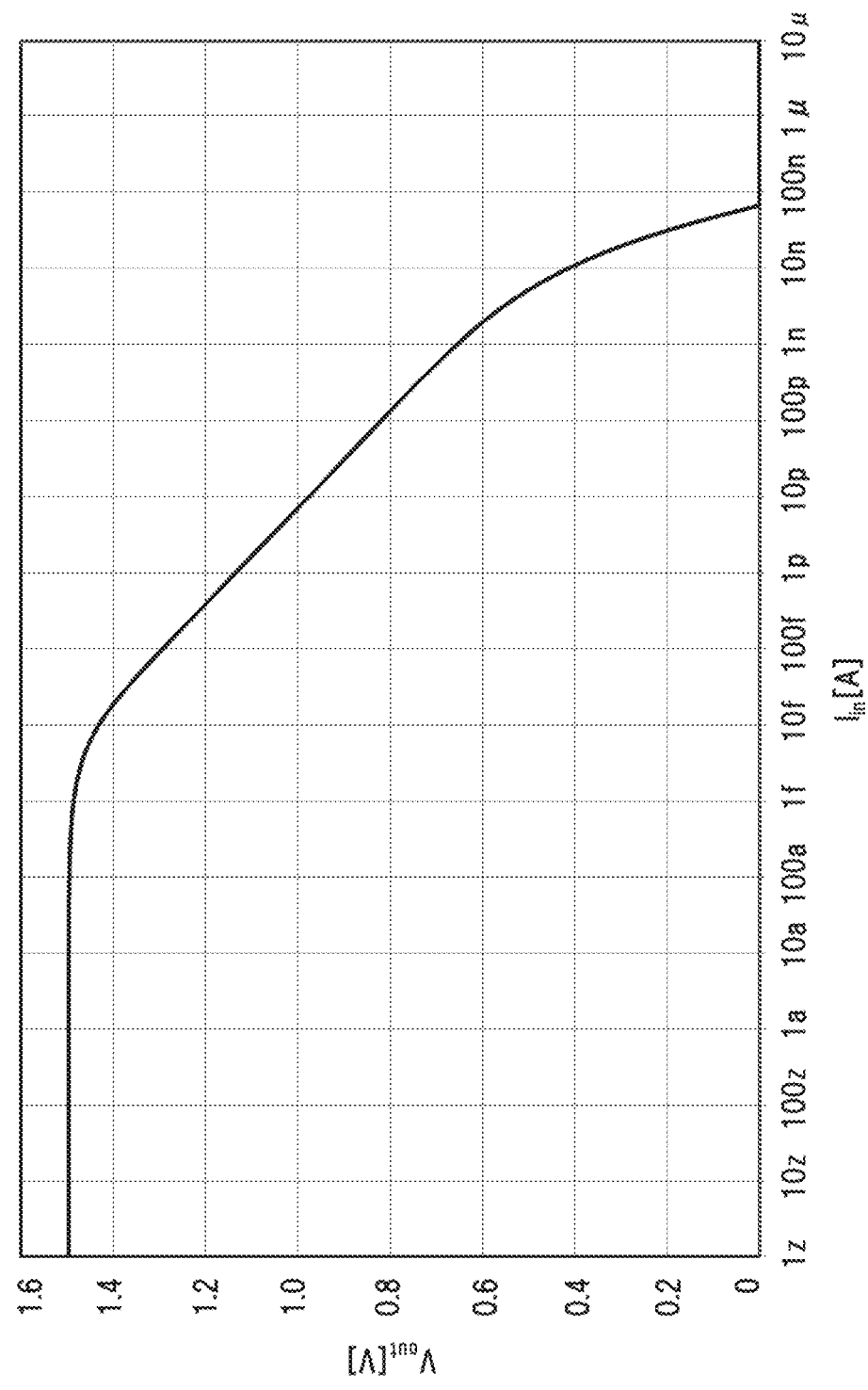
FIG. 16 is a diagram showing results of the circuit calculation.

FIG. 16 shows that the output voltage $V_{out}$ is output as a constant voltage of approximately 1.5 V when the current $I_{in}$ of 1 zA to a value around 1 fA is input to the input terminal IT. This is because a differential voltage input to the operational amplifier OP1 is out of the operating range, and the output voltage $V_{out}$ is saturated to approximately 1.5 V to be output in the circuit 20S. Therefore, different output voltages $V_{out}$ cannot be output at the current $I_{in}$ of 1 zA to the value around 1 fA, and thus, the current $I_{in}$ of 1 zA to the value around 1 fA cannot be measured. Note that the characteristics of the output voltage $V_{out}$ at the current $I_{in}$ of 1 zA to the value around 1 fA correspond to the diode characteristics of the transistor M1 (FIG. 15) at the time when the current Id is approximately 1 fA or less, in which Vg of the transistor M1 is approximately 0 V.

Furthermore, when the current $I_{in}$ around 2 nA is input to the input terminal IT, the output voltage $V_{out}$ is output as approximately 0.6 V; after that, when the current $I_{in}$ is increased, the voltage $V_{out}$ is decreased steeply to be 0 V at around 70 nA. Such current $I_{in}$-output voltage $V_{out}$ characteristics correspond to diode characteristics of the transistor M1 (FIG. 15) at the time when the current Id is in the range of approximately greater than or equal to 2 nA and less than or equal to 70 nA, and the diode characteristics of the transistor M1 in this current range have a gentle slope as compared to those in the range of greater than or equal to 100 pA and less than 2 nA.

Then, when current $I_{in}$ greater than the value around 70 nA is input to the input terminal IT, the output voltage $V_{out}$ is output as a constant voltage of approximately 0 V On the other hand, in the diode characteristics of the transistor M1 (FIG. 15), when the current Id of 70 nA or more flows, Vg of the transistor M1 is approximately greater than or equal to 1.5 V; however, in the circuit 20S, the differential voltage input to the operational amplifier OP1 is out of the operating range, and thus, the output voltage $V_{out}$ is saturated to approximately 0 V to be output. Thus, in the case where the current $I_{in}$ greater than the value around 70 nA is input to the input terminal IT, Vg of the transistor M1 is a constant voltage of approximately 1.5 V.

Figure 17:
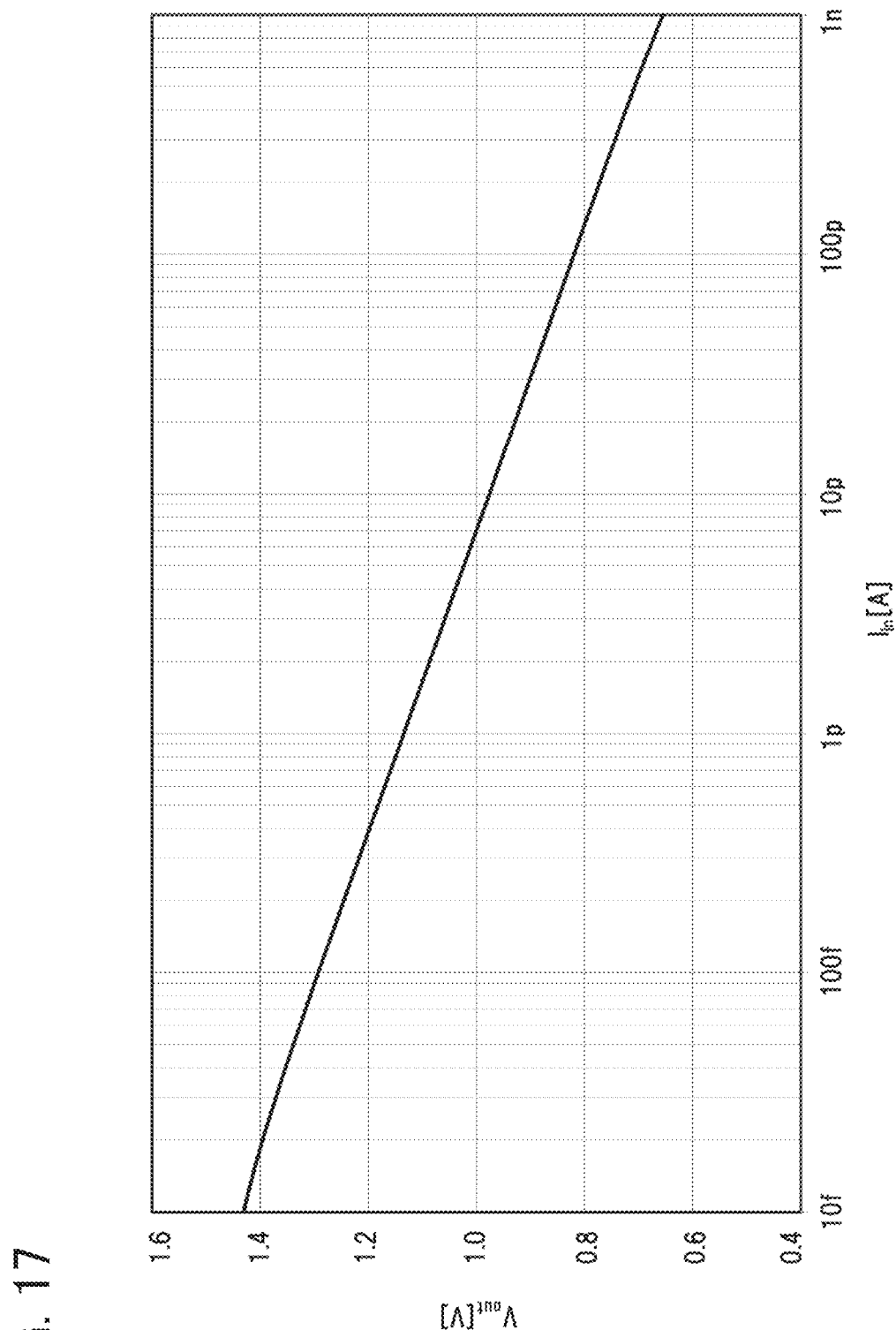
FIG. 17 is a diagram showing results of the circuit calculation.

Here, FIG. 17 shows enlarged current-voltage characteristics at the current $I_{in}$ in the range of 10 fA to 1 nA in FIG. 16. According to FIG. 17, the output voltage $V_{out}$ can be represented as a linear expression having a negative slope when the current $I_{in}$ is in the range of 10 fA to 1 nA. The range represented by the linear expression is referred to as a measurable region. Note that this region corresponds to the range at the current Id of 10 fA to 1 nA of the diode characteristics of the transistor M1 (FIG. 15). Thus, when the diode-connected transistor M1 is used as a diode element, the circuit 20S can measure the current $I_{in}$ of 10 fA to 1 nA.

Figure 18:
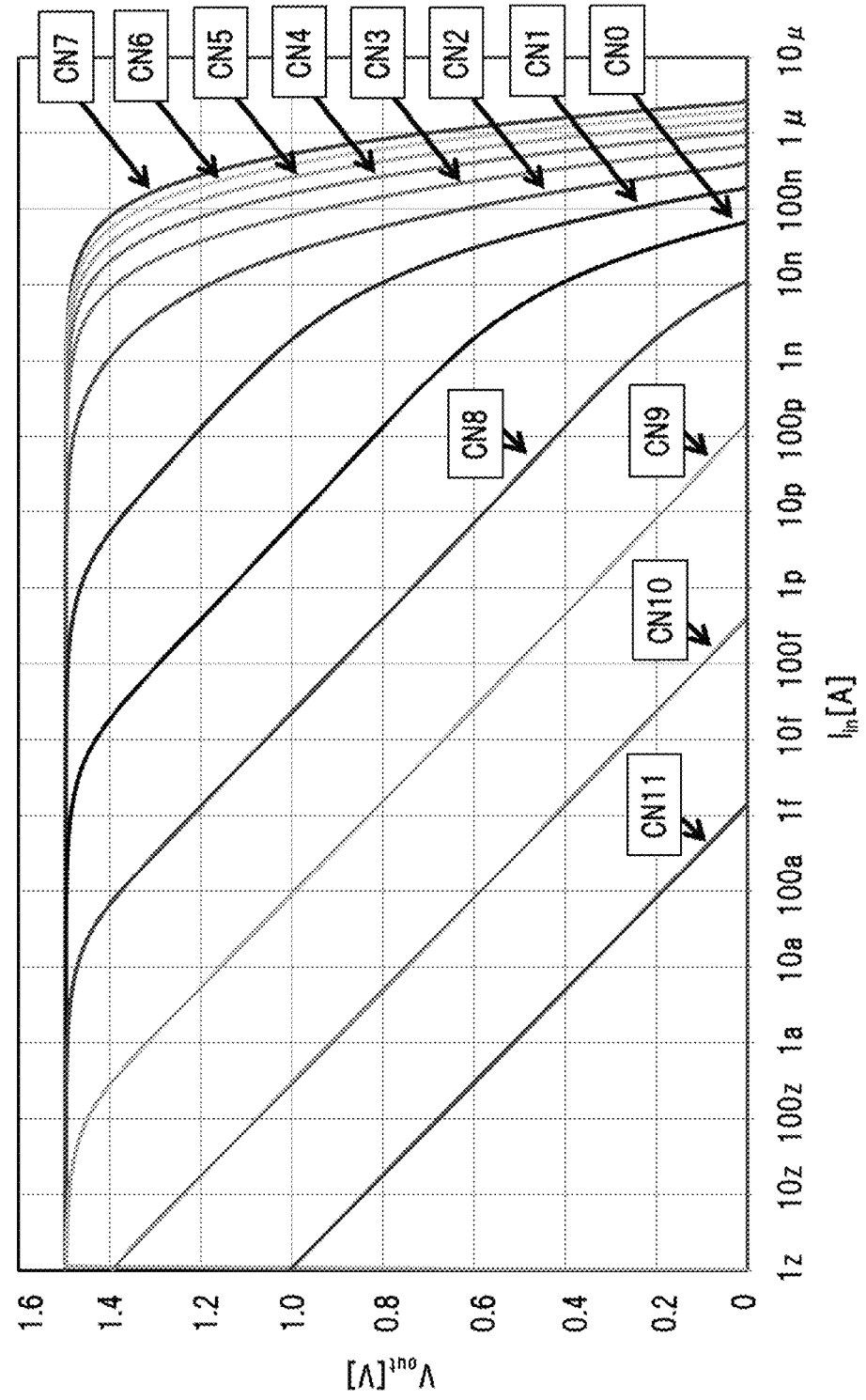
FIG. 18 is a diagram showing results of the circuit calculation.

Next, FIG. 18 shows current-voltage characteristics of the circuit 20S at the time when the threshold voltage of the transistor M1 is changed from 0.83 V to the positive side and from 0.83 V to the negative side. The threshold voltage is changed in accordance with a condition CN0 to a condition CN11. The condition CN0 is the same condition as the current-voltage characteristics of the circuit 20S shown in FIG. 16 and is a condition in which the threshold voltage of transistor M1 is 0.83 V. The condition CN1 to the condition CN7 are conditions in which the threshold voltage of the transistor M1 on the condition CN0 is shifted to the negative side, and the shift amounts of the threshold voltage on the respective conditions are –0.4 V, –0.8 V, –1.2 V, –1.6 V, –2.0 V, –2.4 V, and –2.8 V. The condition CN8 to the condition CN11 are each a condition in which the threshold voltage of the transistor M1 on the condition CN0 is shifted to the positive side, and the shift amounts of the threshold voltage on the respective conditions are 0.4 V, 0.8 V, 1.2V, and 1.6 V.

When the condition is changed from the condition CN0 to the condition CN7 and the threshold voltage of the transistor M1 is decreased from 0 V, in a region having a slope of the current-voltage characteristics, the slope becomes steep in the negative side; therefore, the measurable region of the current $I_{in}$ is narrowed.

On the other hand, when the condition was change from the condition CN0 to the condition CN8 to the condition CN11 and the threshold voltage of the transistor M1 was increased from 0 V, the measurable region was in the range of a value around 100 aA to a value around 1 nA on the condition CN8, in the range of a value around 1 aA to a value around 100 pA on the condition CN9, and in the range of a value around 1 zA to a value around 1 pA on the condition CN10. This shows that when the threshold voltage of the transistor M1 is shifted to the positive side, a more minute current can be measured in the circuit 20S.

Example 2

<High-Temperature Characteristics of CAAC-IGZO FET>

A field-effect OS transistor (hereinafter, referred to as a CAAC-IGZO FET) that can be provided in the semiconductor device of one embodiment of the present invention has low temperature dependence and can operate stably even in a high-temperature environment. In this example, an experiment on high-temperature characteristics of the CAAC-IGZO FET and results thereof will be described.

The CAAC-IGZO FET can be manufactured by a BEOL (Back End Of Line) process in a semiconductor manufacturing process for CMOS or the like. Thus, stacking with a Si transistor (among Si transistors, a field-effect Si transistor is also referred to as a "Si FET") is possible. For example, an application in which a circuit that needs high-speed operation is manufactured by a CMOS process and a circuit that requires a low leakage current is manufactured by a CAAC-IGZO process is possible.

The off-state current of the Si FET increases as the temperature increases, whereas the off-state current of the CAAC-IGZO FET is always below the measurement limit. Accordingly, the temperature characteristics of the off-state current of a Si FET with L (channel length)/W (channel width)=60 nm/120 nm and the off-state current of a CAAC-IGZO FET with L/W=60 nm/60 nm were compared. The off-state current of both FETs was measured using the circuit illustrated in FIG. 19.

Figure 19:
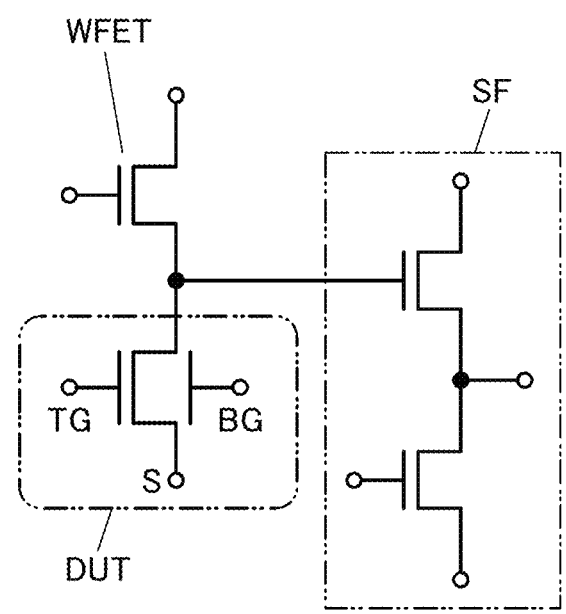
FIG. 19 is a diagram illustrating a measurement circuit.

A circuit illustrated in FIG. 19 includes an FET serving as a DUT (Device Under Test), a write transistor WFET, and a read circuit SF. The write transistor WFET is a CAAC-IGZO FET. The read circuit SF includes CAAC-IGZO FETs connected in series. A terminal S of the FET serving as the DUT functions as a terminal to which a source voltage is input. Note that a CAAC-IGZO FET including a top gate TG and a back gate BG is illustrated as the DUT in FIG. 19, and it is not limited thereto in the case where the DUT is a Si FET.

In the case where a Si FET was the DUT in FIG. 19, the measurement conditions of the off-state current of the Si FET were as follows: a gate voltage $V_G$=–1.0 V, a source voltage $V_S$=0 V, a drain voltage $V_D$=1.2 V, and a body voltage $V_S$=0 V In the case where a CAAC-IGZO FET was the DUT in FIG. 19, the measurement conditions of the off-state current of the CAAC-IGZO were as follows: the gate voltage $V_G$=–2.0 V, the source voltage $V_S$=0 V, the drain voltage $V_D$=2.0 V, and a back gate voltage $V_{BG}$=–3.0 V.

Figure 20:
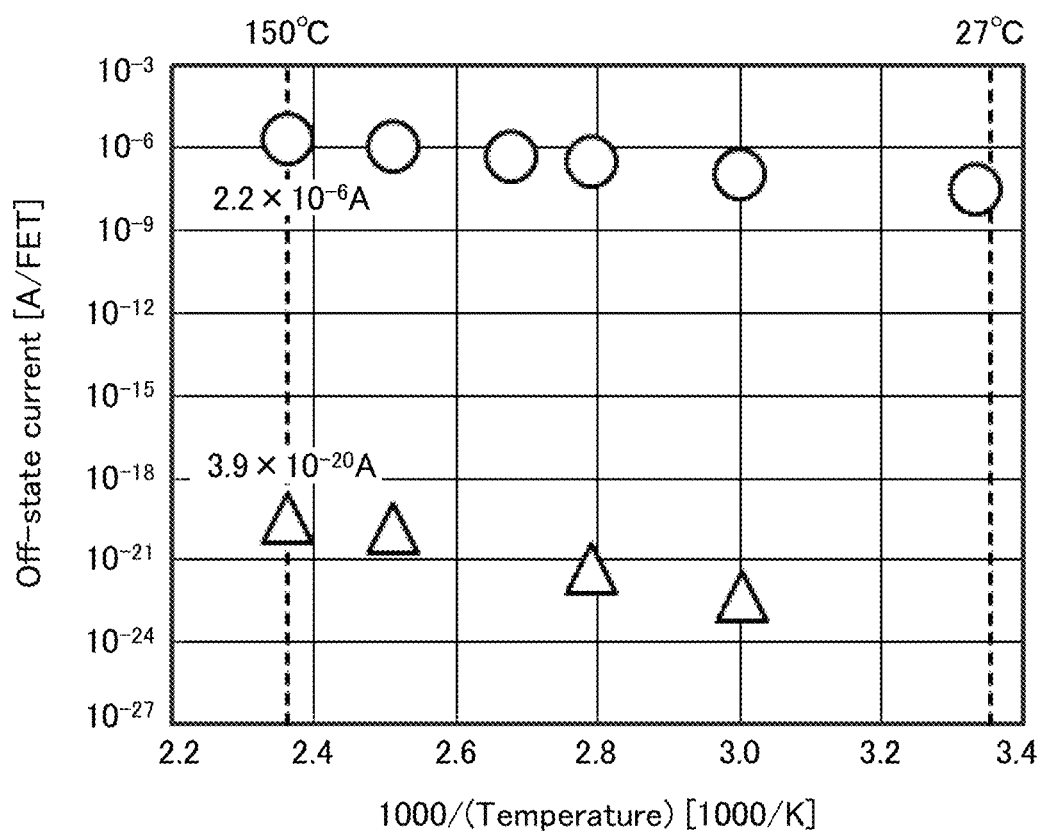
FIG. 20 is a diagram showing temperature dependence of off-state current.

FIG. 20 shows the measurement results. At a measurement temperature of 150° C., the off-state current of the Si FET was approximately 2.2×10$^{-6}$ A, and the off-state current of the CAAC-IGZO FET was approximately 3.9×10$^{-20}$ A. The CAAC-IGZO FET can maintain a low off-state current even in a high-temperature environment. By adjusting the back gate voltage, the off-state current can be further reduced.

Figure 21:
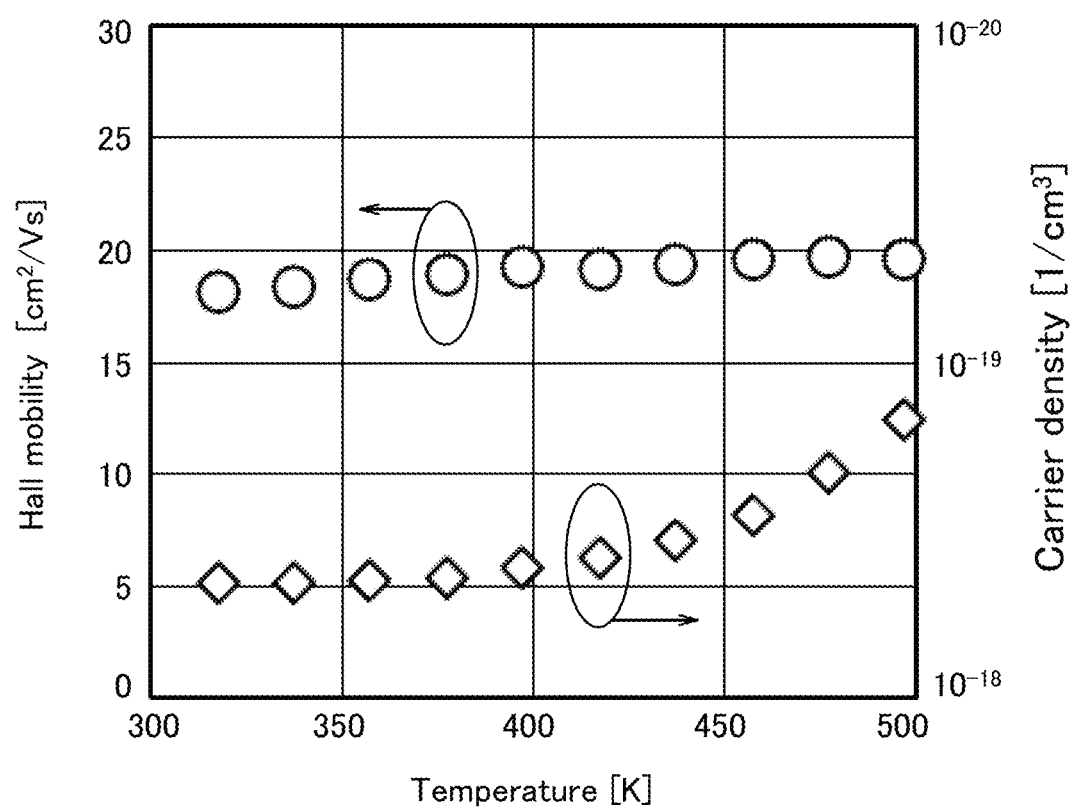
FIG. 21 is a diagram showing temperature dependence of Hall mobility and carrier density of a CAAC-IGZO film.

Next, FIG. 21 shows the temperature dependence of the Hall mobility and the carrier density of a CAAC-IGZO film. It is found from FIG. 21 that the Hall mobility of the CAAC-IGZO film hardly changes with respect to temperature change. The Hall mobility of the CAAC-IGZO film does not decrease even at high temperatures because it is assumed to be dominated by Coulomb scattering rather than phonon scattering.

Next, the cutoff frequency $f_T$ of the CAAC-IGZO FET and the Si FET at 27° C. and 150° C. was measured. For the DUT to be measured, a Si FET with L/W=60 nm/480 nm and a CAAC-IGZO FET with L/W=21 nm/25 nm were used. For the Si FET measurement, 21 Si FETs were connected in parallel (M=21). For the CAAC-IGZO FET measurement, 672 CAAC-IGZO FETs were connected in parallel (M=672).

Figure 22:
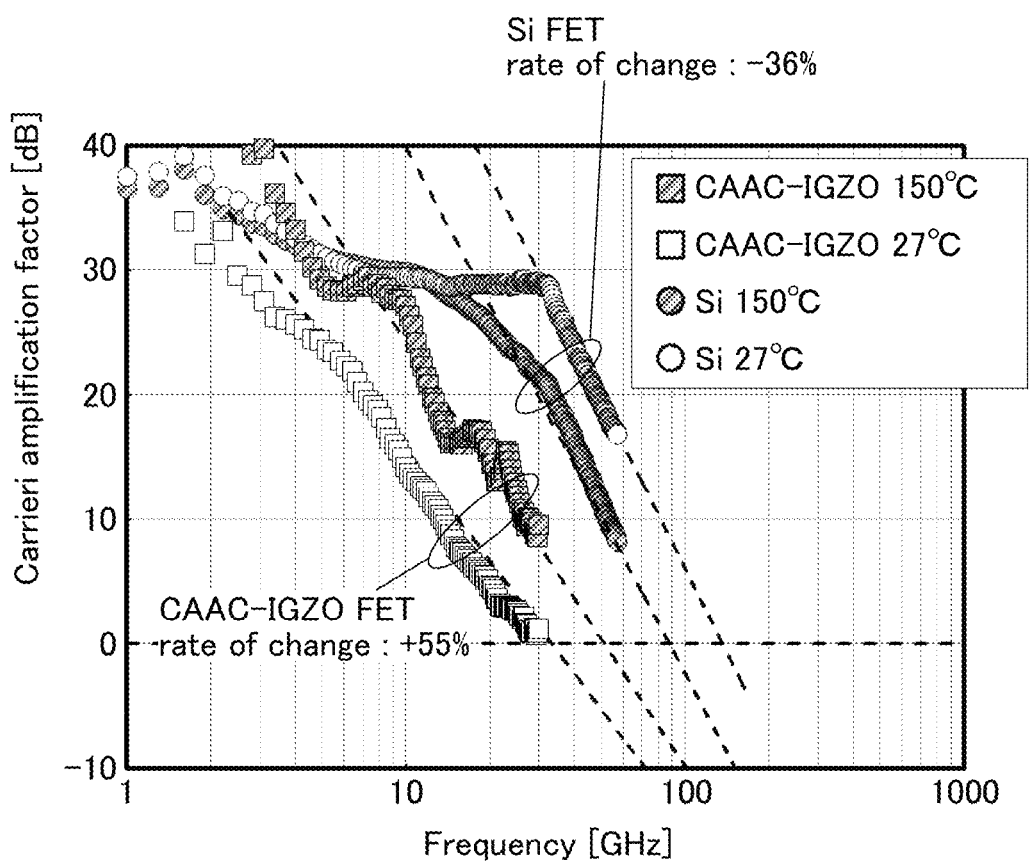
FIG. 22 is a diagram showing temperature dependence of cutoff frequency.

FIG. 22 shows the measurement results. The rate of change in the cutoff frequency $f_T$ of the Si FET from 27° C. to 150° C. was −36%, and the rate of change in the cutoff frequency $f_T$ of the CAAC-IGZO FET from 27° C. to 150° C. was +55%. In the obtained characteristics of the CAAC-IGZO FET, the cutoff frequency $f_T$ at 27° C. and the cutoff frequency $f_T$ at 150° C. were not decreased but increased, as compared to those in the case of the Si FET. In this measurement, the cutoff frequency of the Si FET at a measurement temperature of 150° C. and VD of 1.2 V was 88 GHz, and the cutoff frequency $f_T$ of the CAAC-IGZO FET at a measurement temperature of 150° C. and VD of 2.5 V was 51 GHz.

These showed that the mobility of the CAAC-IGZO FET was not lowered by an increase in the temperature for the cutoff frequency $f_T$ than that of the Si FET. It was also found that providing the back gate electrode in the CAAC-IGZO FET can inhibit a change in the threshold voltage due to temperature change. It was also found that the amount of change in the cutoff frequency $f_T$ with respect to temperature change is smaller in the CAAC-IGZO FET than in the Si FET. It was also found that the CAAC-IGZO FET has an extremely low off-state current of 10$^{-20}$ A even in a high-temperature environment. The use of the CAAC-IGZO FET can achieve a circuit, a semiconductor device, an electronic device, and the like that have low power consumption in an environment with a wide operating temperature range.

Example 3

<Threshold Voltage Variation and Reliability of CAAC-IGZO FET>

In a CAAC-IGZO FET, which is a field-effect OS transistor that can be provided in the semiconductor device of one embodiment of the present invention, variation in the threshold voltage is small and change in the threshold voltage due to deterioration is also small. Therefore, the CAAC-OS FET has high reliability. In this example, results of investigation of the degree of variation in the threshold voltage of the CAAC-IGZO FET and measurement results of change in the threshold voltage of the CAAC-OS FET in an acceleration test will be described.

First, the investigation of the degree of variation in the threshold voltage of the CAAC-IGZO FET is described. As an investigation method, 512 CAAC-IGZO FETs with L/W=60 nm/60 nm were formed in the plane of one wafer, characteristic of a gate-source voltage $V_{GS}$ versus a source-drain current $I_{DS}$ of each of the CAAC-IGZO FETs were measured, and the threshold voltage $V_{th}$ of the CAAC-IGZO FET was estimated from the measured characteristics of each of the CAAC-IGZO FETs. Note that the threshold voltage $V_{th}$ described here was calculated from the source-drain current $I_{DS}$ in a saturation region on the assumption that the CAAC-IGZO applied to a gradual channel approximation. As for the measurement conditions of the characteristics of the gate-source voltage $V_{GS}$ versus the source-drain current $I_{DS}$, the source-drain voltage $V_{DS}$ of the CAAC-IGZO FET was 1.2 V and the back gate-source voltage VBS thereof was 0 V.

Figure 23:
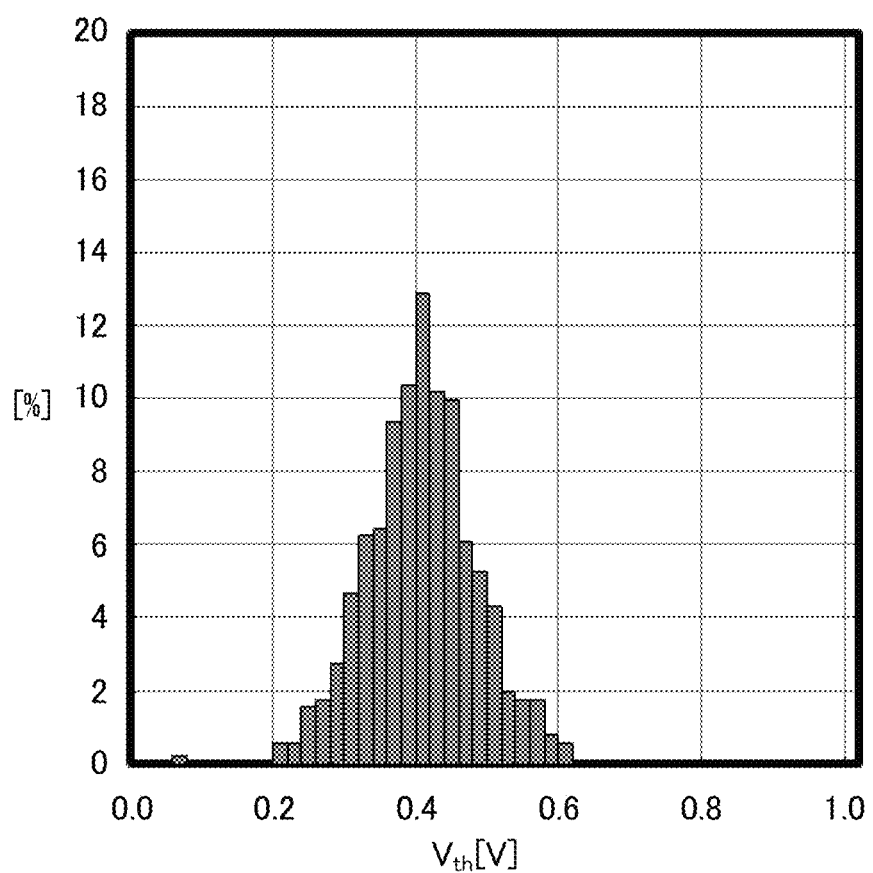
FIG. 23 is a distribution diagram showing variation in the threshold voltages of a plurality of FETs.

FIG. 23 is a distribution diagram showing the percentages of the threshold voltages $V_{th}$ of the 512 CAAC-IGZO FETs. An average value μ and a standard deviation σ of the threshold voltages $V_{th}$ of the CAAC-IGZO FETs were estimated as 388 mV and 76 mV from the calculation results. These results showed that the CAAC-IGZO FET had small variation in the threshold voltage. In addition, because of the small variation in the threshold voltage, the threshold voltage can be adjusted to, for example, 0 V when the back gate-source voltage VBS is set appropriately.

Next, measurement of change in the threshold voltage of the CAAC-IGZO FET in an acceleration test is described. In the acceleration test, change in the threshold voltage $V_{th}$ of a CAAC-IGZO FET with L/W=60 nm/60 nm was measured in an environment at 150° C., in which the gate voltage $V_G$ was 3.63 V, the source voltage $V_S$ was 0 V, the drain voltage $V_D$ was 0 V, and the back gate voltage VBs was 0 V. Furthermore, in addition to the threshold voltage $V_{th}$, a source-drain current $I_{ds}$, an S value (subthreshold swing, referred to as SS, for example), and field-effect mobility $\mu_{FE}$ were also measured in the acceleration test. Note that the S value is the minimum value of the change amount of a gate voltage that is necessary for a drain current to change by one digit; as the S value is reduced, switching operation between on and off of a transistor can be performed more steeply.

In addition, to measure the physical value, characteristics, and the like of each of the CAAC-IGZO FETs, the source-drain voltage $V_{DS}$ was set 1.2 V, the back gate voltage VBs was set 0 V, and the source-drain current $I_{ds}$ was obtained at arbitrary timing in the acceleration test. The threshold voltage $V_{th}$ was a gate-source voltage at the time when the source-drain current $I_{ds}$ was 1.0×10$^{-12}$ A.

Figure 24A:
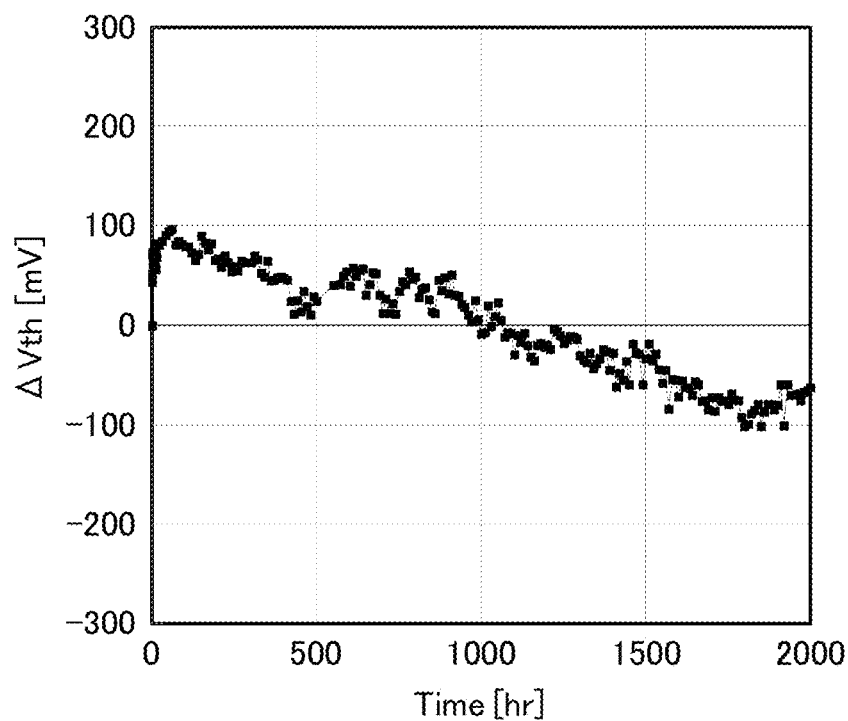
FIG. 24A and FIG. 24B are diagrams showing results of an acceleration test.
Figure 24B:
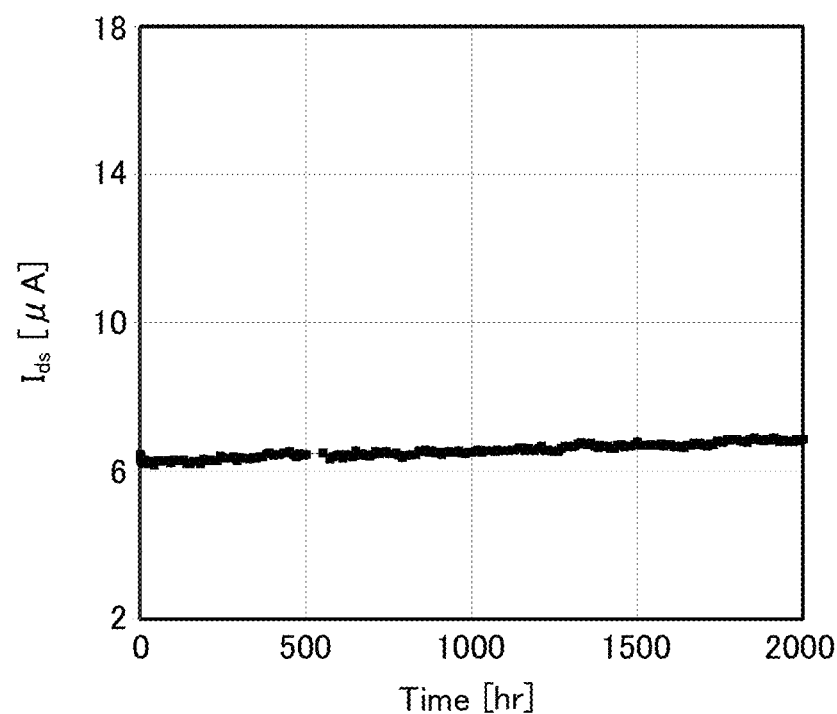
Figure 25A:
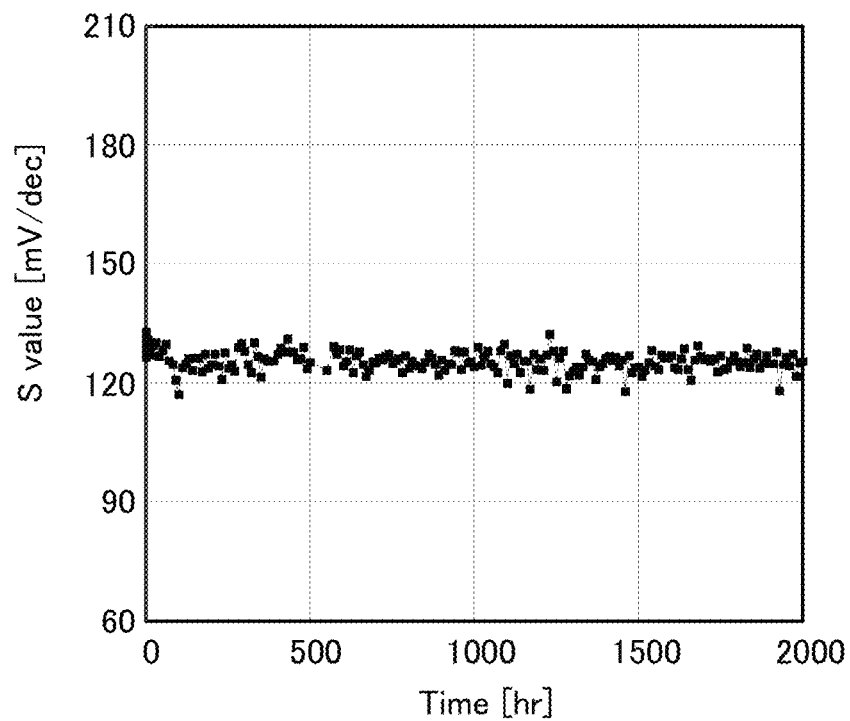
FIG. 25A and FIG. 25B are diagrams showing results of an acceleration test.
Figure 25B:
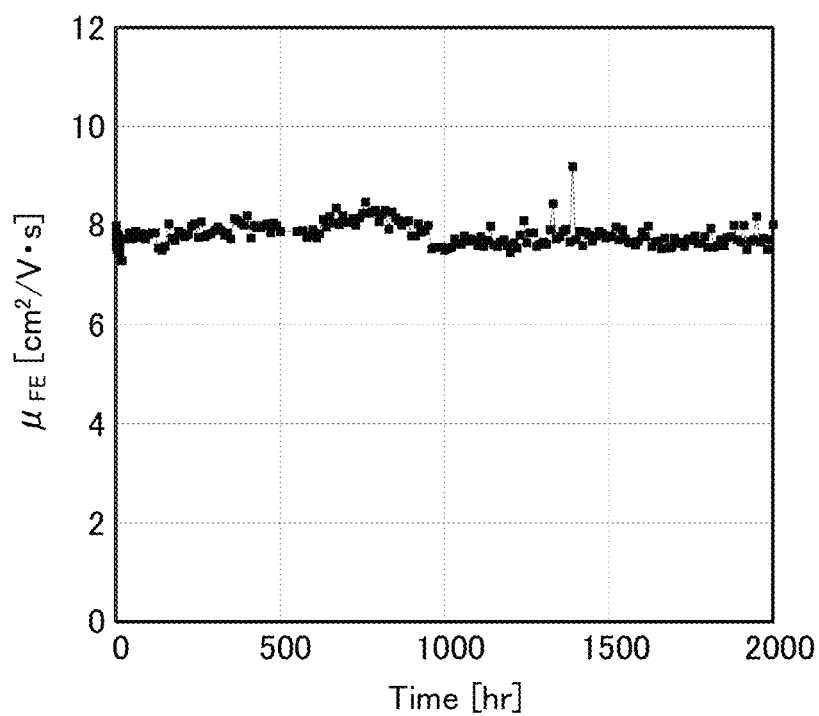

FIG. 24A, FIG. 24B, FIG. 25A, and FIG. 25B show changes over time of the threshold voltage $V_{th}$, the source-drain current $I_{ds}$, the S value, and the field-effect mobility $\mu_{FE}$ by a 2000-hour acceleration test, respectively. The results in FIG. 24A showed that the change amount of the threshold voltage $|\Delta V_{th}|$ of the CAAC-IGZO FET from the beginning of the acceleration test to 1790 hours was less than or equal to 100 mV. In addition, the results in FIG. 24B, FIG. 25A, and FIG. 25B showed that the change amount of each of the source-drain current $I_{ds}$, the S value, and the field-effect mobility $\mu_{FE}$ in the acceleration test was also small as in FIG. 24A.

It was found from the above results that the plurality of CAAC-IGZO FETs formed on one wafer at the same time had small variation in the threshold voltage. Thus, the use of the CAAC-OS FET enables an increase in yield of a circuit, a semiconductor device, an electronic device, or the like. It was also found that the CAAC-IGZO FET had high reliability in the threshold voltage, the source-drain current $I_{ds}$, the S value, and the field-effect mobility $\mu_{FE}$. Accordingly, the use of the CAAC-IGZO FET makes it possible to achieve a highly reliable circuit, semiconductor device, electronic device, or the like.

Note that this example can be combined with any of the embodiments described in this specification as appropriate.

REFERENCE NUMERALS

M1: transistor, DE: diode element, C1: capacitor, OP1: operational amplifier, OSC: circuit, CE: circuit, IT: input terminal, OT: output terminal, DT: high power supply potential input terminal, ST: low power supply potential input terminal ST, GNDL: wiring, VC1: constant voltage source, VC2: constant voltage source, CC1: constant voltage source, IVC1a: characteristic, IVC1b: characteristic, IVC2: characteristic, TG: top gate, BG: back gate, S: terminal, WFET: write transistor, SF: read circuit, 10: circuit, 20: circuit, 20A: circuit, 20S: circuit, 21: circuit, 21A: circuit, 21B: circuit, 21C: circuit, 21D: circuit, 21E: circuit, 30: detection unit, 40: processing unit, 50: memory unit, 60: display unit, 70: power supply circuit, 90: detection object, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 500: transistor, 503: conductor, 503a: conductor, 503b: conductor, 505: conductor, 510: insulator, 512: insulator, 514: insulator, 516: insulator, 518: conductor, 520: insulator, 522: insulator, 524: insulator, 530: oxide, 530a: oxide, 530b: oxide, 530c: oxide, 540: conductor, 540a: conductor, 540b: conductor, 542a: conductor, 542b: conductor, 543a: region, 543b: region, 544: insulator, 546: conductor, 548: conductor, 550: insulator, 560: conductor, 560a: conductor, 560b: conductor, 574: insulator, 580: insulator, 581: insulator, 582: insulator, 586: insulator, 600: capacitor, 600A: capacitor, 600B: capacitor, 610: conductor, 611: conductor, 612: conductor, 620: conductor, 630: insulator, 631: insulator, 640: insulator, 650: insulator, 651: insulator, 4700: electronic component, 4701: lead, 4702: printed circuit board, 4704: mounting board, 4710: semiconductor device, 4730: electronic component, 4731: interposer, 4732: package substrate, 4733: electrode, 4735: semiconductor device, 4800: semiconductor wafer, 4800a: chip, 4801: wafer, 4801a: wafer, 4802: circuit portion, 4803: spacing, 4803a: spacing, 5300: ICD body, 5301a: battery, 5301b: battery, 5302: wire, 5303: wire, 5304: antenna, 5305: subclavian vein, 5306: superior vena cava, 5900: sensor, 5931: electrode, 5932: wiring, 6140: robot, 6141a: contact sensor, 6141b: contact sensor, 6141c: contact sensor, 6141d: contact sensor, 6141e: contact sensor, 6150: industrial robot, 6151: function unit, 6152: control unit, 6153: drive shaft, 6154: drive shaft, 6155: drive shaft, 6240: digital camera, 6241: housing, 6242: display unit, 6243: operation button, 6244: shutter button, 6246: lens, 6300: video camera, 6301: first housing, 6302: second housing, 6303: display unit, 6304: operation key, 6305: lens, 6306: joint, 6900: alarm, 6901: sensor, 6902: receiver, 6903: transmitter, 6904: sensor circuit, 6905: window, 6906: operation key, 6907: display unit, 6908: operation key, 6909: operation key, 6910: wiring, 6911: speaker, 6912: lighting device This application is based on Japanese Patent Application Serial No. 2018-196390 filed on Oct. 18, 2018 and Japanese Patent Application Serial No. 2019-011578 filed on Jan. 25, 2019, the entire contents of which are hereby incorporated herein by reference.

The invention claimed is:

1. A semiconductor device comprising:
a transistor comprising a gate and a metal oxide in a channel formation region; and
an operational amplifier,
wherein an inverting input terminal of the operational amplifier is electrically connected to a first terminal of the transistor and the gate of the transistor,
wherein the operational amplifier is a single-polarity circuit using transistors comprising the metal oxide in channel formation regions,
wherein an output terminal of the operational amplifier is electrically connected to a second terminal of the transistor, and
wherein an off-state current of the transistor is less than or equal to $1.0 \times 10^{-12}$ A.

2. The semiconductor device according to claim 1,
wherein the off-state current of the transistor is less than or equal to $1.0 \times 10^{-15}$ A.

3. The semiconductor device according to claim 1,
wherein the metal oxide comprises indium, gallium, and zinc.

4. The semiconductor device according to claim 1,
wherein a non-inverting input terminal of the operational amplifier is electrically connected to a wiring.

5. A semiconductor wafer comprising the semiconductor device according to claim 1.

6. A semiconductor device comprising:
a first transistor and a second transistor each comprising a gate, a back gate, and a metal oxide in a channel formation region; and
an operational amplifier,
wherein an inverting input terminal of the operational amplifier is electrically connected to a first terminal of the first transistor and the gate of the first transistor,
wherein a second terminal of the first transistor is electrically connected to a first terminal of the second transistor,
wherein the gate of the second transistor is electrically connected to the inverting input terminal of the operational amplifier,
wherein an output terminal of the operational amplifier is electrically connected to a second terminal of the second transistor,
wherein the operational amplifier is a single-polarity circuit using transistors comprising the metal oxide in channel formation regions, and
wherein an off-state current of the first transistor and an off-state current of the second transistor are made less than or equal to $1.0 \times 10^{-15}$ A by inputting a potential that shifts a threshold voltage of the first transistor and a threshold voltage of the second transistor to a positive side, to the back gate of the first transistor and the back gate of the second transistor.

7. The semiconductor device according to claim 6,
wherein the off-state current of the first transistor and the off-state current of the second transistor are less than or equal to $1.0 \times 10^{-15}$ A.

8. The semiconductor device according to claim 6, wherein the metal oxide comprises indium, gallium, and zinc.

9. The semiconductor device according to claim 6, wherein a non-inverting input terminal of the operational amplifier is electrically connected to a wiring.

10. A semiconductor wafer comprising the semiconductor device according to claim 6.

* * * * *